US012342644B2

(12) United States Patent
Sato

(10) Patent No.: US 12,342,644 B2
(45) Date of Patent: Jun. 24, 2025

(54) IMAGING APPARATUS

(71) Applicant: Panasonic Intellectual Property Management Co., Ltd., Osaka (JP)

(72) Inventor: Yoshihiro Sato, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 472 days.

(21) Appl. No.: 18/055,408

(22) Filed: Nov. 14, 2022

(65) Prior Publication Data

US 2023/0079616 A1 Mar. 16, 2023

Related U.S. Application Data

(63) Continuation of application No. PCT/JP2021/016258, filed on Apr. 22, 2021.

(30) Foreign Application Priority Data

Jun. 2, 2020 (JP) ................................ 2020-096478

(51) Int. Cl.
*H10F 39/00* (2025.01)
*H10F 39/15* (2025.01)

(52) U.S. Cl.
CPC ....... *H10F 39/8037* (2025.01); *H10F 39/151* (2025.01); *H10F 39/802* (2025.01)

(58) Field of Classification Search
None
See application file for complete search history.

(56) References Cited

U.S. PATENT DOCUMENTS

2013/0258311 A1 10/2013 Mase et al.
2014/0043510 A1 2/2014 Kasuga et al.
2015/0109503 A1 4/2015 Mori et al.
2016/0204156 A1 7/2016 Togashi
(Continued)

FOREIGN PATENT DOCUMENTS

JP 2013-206903 10/2013
JP 2018-098495 6/2018
(Continued)

OTHER PUBLICATIONS

International Search Report of PCT application No. PCT/JP2021/016258 dated Jul. 27, 2021.

*Primary Examiner* — Kyoung Lee
(74) *Attorney, Agent, or Firm* — Rimon P.C.

(57) ABSTRACT

An imaging apparatus includes a substrate, a first electrode, a second electrode, a photoelectric conversion layer, a first transistor, and a penetrating electrode. The photoelectric conversion layer is located between the first electrode and the second electrode and converts light into charges. The first transistor includes a first impurity region serving as one of a source and a drain, a second impurity region serving as the other of the source and the drain, and a first gate electrode. The penetrating electrode penetrates the substrate and electrically connects the first electrode to the first impurity region. The charges are accumulated in the first impurity region. A distance between the first impurity region and the penetrating electrode is longer in a plan view than a distance between the second impurity region and the penetrating electrode.

9 Claims, 23 Drawing Sheets

10A
82
30
31
1A
1i
15
14
13
12
33
33A
33B
32A
32B
32
81
1
26
22
24
67n, FD
68an
68bn
68cn
68dn
70
1B
71
cp1
cp2
cp3
cp4
24e
26e
22e
80a
80b
80c
80

(56) References Cited

U.S. PATENT DOCUMENTS

2017/0148838 A1* 5/2017 Togashi ................ H10F 39/191
2019/0326345 A1 10/2019 Yamamoto et al.

FOREIGN PATENT DOCUMENTS

WO 2012/147302 11/2012
WO 2014/002330 1/2014
WO 2015/025723 2/2015

* cited by examiner 10A
30
31
1A
1i
1B
15
14
13
12
1
70
71
80a
80b
80c
80
32A
32B
32
33A
33B
33
81
82
68dn
68cn
68bn
68an
67n, FD
24
22
26
24e
22e
26e
cp1
cp2
cp3
cp4

30
31
15
14
13
12
1
70
71
80a
80b
80c
80
68dn
24e
24
68cn
22e
22
32A
32B
32
81
68bn
cp3
82
33A
33B
33
68an
cp4
26
26e
67n, FD
cp1
1A
1i
1B 10B
30
82
15Z
14Z
13Z
12Z
15Y
14Y
13Y
12Y
15X
14X
13X
12X
1
70
71
80a
80b
80c
80
68dn
24X
24eX
68cn
22X
22eX
32A
32B
32
81X
68bn
cp3
cp2
68an
cp4
33A
33B
33
26X
26eX
67n, FDX
cp1
31Z
31Y
31X
1A
1i
1B 10C
30
15Z
14Z
13Z
12Z
15X
14X
13X
12X
1
70
71
80a
80b
80c
80
27Y
28Y
28eY
67n, FDX
cp1
26X
26eX
32A
32B
32
81X
68an
cp4
82
cp2
22eX
cp3
33A
33B
33
68bn
22X
68cn
24X
68dn
31Z
31X
1A
1i
1B
24eX 10D
30
15Y
14Y
13Y
12Y
1
70
71
80a
80b
80c
80
27Z
27X
28X
28eX
32A
32B
32
81Y
26Y
67n, FDY
68an
cp1
26eY
cp4
cp2
82
33A
33B
33
22Y
68bn
22eY
cp3
24Y
68cn
68dn
31Y
1A
1i
1B
24eY

IMAGING APPARATUS

BACKGROUND

1. Technical Field

The present disclosure relates to an imaging apparatus.

2. Description of the Related Art

Charge coupled device (CCD) image sensors and complementary metal oxide semiconductor (CMOS) image sensors are widely employed in digital cameras. These image sensors include photodiodes formed in a semiconductor substrate.

International Publication Nos. 2014/002330 and 2012/147302 disclose a structure where a photoelectric converter having a photoelectric conversion layer is arranged on or above a semiconductor substrate. An imaging apparatus having such a structure may be referred to as a laminated-type imaging apparatus. In the laminated-type imaging apparatus, charges created through photoelectric conversion are accumulated in a charge accumulation region. A signal responsive to an amount of charges accumulated in the charge accumulation region is read via a CCD circuit or CMOS circuit formed in a semiconductor substrate.

International Publication No. 2015/025723 discloses a back-illuminated type imaging apparatus. The imaging apparatus disclosed in International Publication No. 2015/025723 includes photodiodes formed in a semiconductor substrate. The imaging apparatus disclosed in International Publication No. 2015/025723 also includes a photoelectric converter having a photoelectric conversion layer on a back side of the semiconductor substrate serving as a light-incident side.

SUMMARY

One non-limiting and exemplary embodiment provides a technique appropriate to control a leakage current into a charge accumulation region.

In one general aspect, the techniques disclosed here feature an imaging apparatus including: a substrate; a first electrode; a second electrode; a photoelectric conversion layer that is located between the first electrode and the second electrode and that converts light into charges, a first transistor that includes a first impurity region serving as one of a source and a drain, a second impurity region serving as the other of the source and the drain, and a first gate electrode; and a penetrating electrode that penetrates the substrate and that electrically connects the first electrode to the first impurity region. The charges are accumulated in the first impurity region. A distance between the first impurity region and the penetrating electrode is longer in a plan view than a distance between the second impurity region and the penetrating electrode.

The technique disclosed in the disclosure may be appropriate to control the leakage current into the charge accumulation region.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
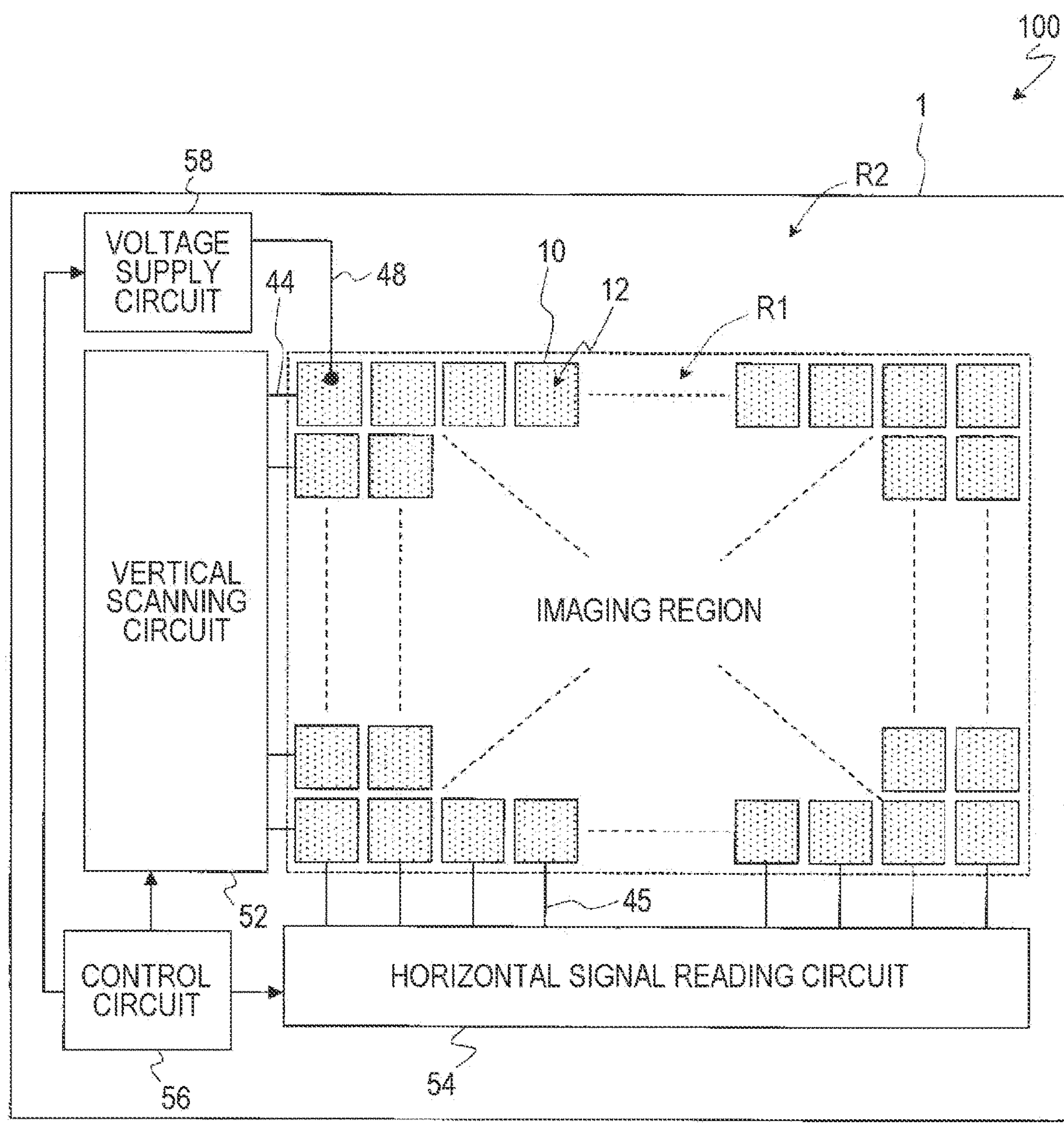
FIG. 1 is a block diagram of an imaging apparatus according to a first embodiment of the disclosure.

Underlying Knowledge Forming Basis of the Present Disclosure

Leakage current into a charge accumulation region may occur in a laminated-type imaging apparatus. The leakage current may degrade a resulting image.

Techniques appropriate to control the leakage current into the charge accumulation region may be provided.

Overview of Aspects of the Disclosure

An imaging apparatus according to a first aspect of the disclosure includes:

a substrate;

a first electrode;

a second electrode;

a photoelectric conversion layer that is located between the first electrode and the second electrode and that converts light into charges;

a first transistor that includes a first impurity region serving as one of a source and a drain, a second impurity region serving as the other of the source and the drain, and a first gate electrode; and a penetrating electrode that penetrates the substrate and that electrically connects the first electrode to the first impurity region. The charges are accumulated in the first impurity region. A distance between the first impurity region and the penetrating electrode is longer in a plan view than a distance between the second impurity region and the penetrating electrode.

The technique related to the first aspect may be appropriate to control the leakage current into the first impurity region that accumulates the charges.

In the imaging apparatus of a second aspect of the disclosure in view of the first aspect, the first gate electrode may be located in a plan view between the penetrating electrode and the first impurity region.

The technique related to the second aspect may be appropriate to control the leakage current into the first impurity region that accumulates the charges.

The imaging apparatus of a third aspect of the disclosure in view of one of the first and second aspects may further include a second transistor including a second gate electrode electrically connected to the first impurity region. The distance between the first impurity region and the penetrating electrode may be longer in a plan view than a distance between the second gate electrode and the penetrating electrode.

The technique related to the third aspect is appropriate to control the leakage current into the first impurity region and noise entering an electrical passage between the second gate electrode of the second transistor and the penetrating electrode.

In the imaging apparatus of a fourth embodiment of the disclosure in view of one of the first through third aspects, an area of the first impurity region may be smaller in a plan view than an area of the second impurity region.

The technique related to the fourth aspect may be appropriate to control the leakage current into the first impurity region.

The imaging apparatus of a fifth aspect of the disclosure in view of one of the first through fourth aspects may further include a first electrical passage that electrically connects the penetrating electrode to the first impurity region. At least part of the first electrical passage may be bent in a plan view.

According to the fifth aspect, the freedom of the layout of the electrical passage may be increased.

The imaging apparatus of a sixth aspect of the disclosure in view of one of the first through fourth aspects may further include:

a first electrical passage that electrically connects the penetrating electrode to the first impurity region; and a gate wiring that is electrically connected to the first gate electrode. If a combination of the first gate electrode and the gate wiring is defined as a second electrical passage, the first electrical passage may circumvent the second electrical passage in a plan view.

According to the sixth aspect, coupling between the first electrical passage and the second electrical passage may be controlled.

The imaging apparatus of a seventh aspect of the disclosure in view of one of the first through fourth aspects may further include:

a first electrical passage that electrically connects the penetrating electrode to the first impurity region; and a gate wiring that is electrically connected to the first gate electrode. If a combination of the first gate electrode and the gate wiring is defined as a second electrical passage, at least part of the first electrical passage may overlap at least part of the second electrical passage in a plan view.

According to the seventh aspect, coupling may be created between the first electrical passage and the second electrical passage.

In the imaging apparatus of an eighth aspect of the disclosure in view of the first through seventh aspects, at least part of the first electrode may overlap at least part of the first impurity region in a plan view.

According to the eighth aspect, light irradiation on the first impurity region may be restricted by the first electrode.

In the imaging apparatus of a ninth aspect of the disclosure in view of one of the first through eighth aspects, the first transistor may be a reset transistor that resets a potential of the first impurity region.

The reset transistor of the ninth aspect is a specific example of the first transistor.

An imaging apparatus includes a plurality of pixels according to a tenth aspect of the disclosure. Each pixel includes.

a substrate;

a first electrode;

a second electrode;

a photoelectric conversion layer that is located between the first electrode and the second electrode and that converts light into charges;

a first transistor including a first impurity region serving as one of a source and a drain; and a penetrating electrode that penetrates the substrate and that electrically connects the first electrode to the first impurity region.

The charges are accumulated in the first impurity region. In each of the pixels, a distance between the first impurity region and the penetrating electrode is longer in a plan view than a distance between the penetrating electrode and the other of the source and the drain of the first transistor.

According to the tenth aspect, each of the pixels may provide the same effect as the first aspect.

Embodiments of the disclosure are described with reference to the drawings. The embodiments are not intended to limit the disclosure.

In the specification, the terms "above," "below," "top surface," and "bottom surface" are used to specify the arrangement of one member with respect to another member and do not intend to limit the posture of the imaging apparatus in operation.

General or specific embodiments may be implemented via an element, a device, a module, a system, or a method.

General or specific embodiments may also be implemented via an element, a device, a module, a system, or a method or any combination thereof.

Additional effects and benefits of the embodiments disclosed herein may be clarified by referring to the specification and drawings. The effects and benefits may be provided by a variety of embodiments and features disclosed in the specification and drawings and one or more effects and benefits may not need to employ all the embodiments and features.

Embodiments of the disclosure are described in detail by referring to the drawings. The embodiments described below are general or specific examples. Numerical values, shapes, materials, elements, layouts of the elements, connection configurations, steps, orders of the steps are recited for exemplary purposes only and do not intend to limit the disclosure. A variety of aspects disclosed in the specification may be combined as long as they are consistent to each other. From among the elements in the embodiments, an element not recited in an independent claim representing the most generic concept may be construed as an optional element. In the discussion that follows, elements having a substantially identical function may be designated with the same reference numeral and the description thereof may not be repeated. To circumvent the use of overcomplicated drawing, some elements may be omitted in drawings.

First Embodiment

FIG. 1 illustrates an example of an imaging apparatus 100 according to a first embodiment of the disclosure. The imaging apparatus 100 in FIG. 1 includes multiple pixels 10 formed on or in a semiconductor substrate 1 and a peripheral circuit.

Each pixel 10 includes a photoelectric converter 12. The photoelectric converter 12 creates positive and negative charges, typically, pairs of holes and electrons in response to the entrance of light. The photoelectric converter 12 may have a photoelectric conversion structure including a photoelectric conversion layer arranged above the semiconductor substrate 1. Referring to FIG. 1, the photoelectric converters 12 of the pixels 10 are separated apart from each other for convenience of explanation. Alternatively, the photoelectric converters 12 of the pixels 10 may be consecutively arranged with no spacing therebetween on the semiconductor substrate 1.

Referring to FIG. 1, the pixels 10 are arranged in multiple rows and multiple columns, specifically, m rows and n columns. It is noted that m and n are independent from each other and are 1 or higher integer. The pixels 10 are two-dimensionally arranged on the semiconductor substrate 1, thus forming an imaging region R1. If each pixel 10 as the photoelectric converter 12 has a photoelectric conversion structure above the semiconductor substrate 1, the imaging region R1 is defined as a region, covered by the photoelectric conversion structure, out of the semiconductor substrate 1.

Figure 10:
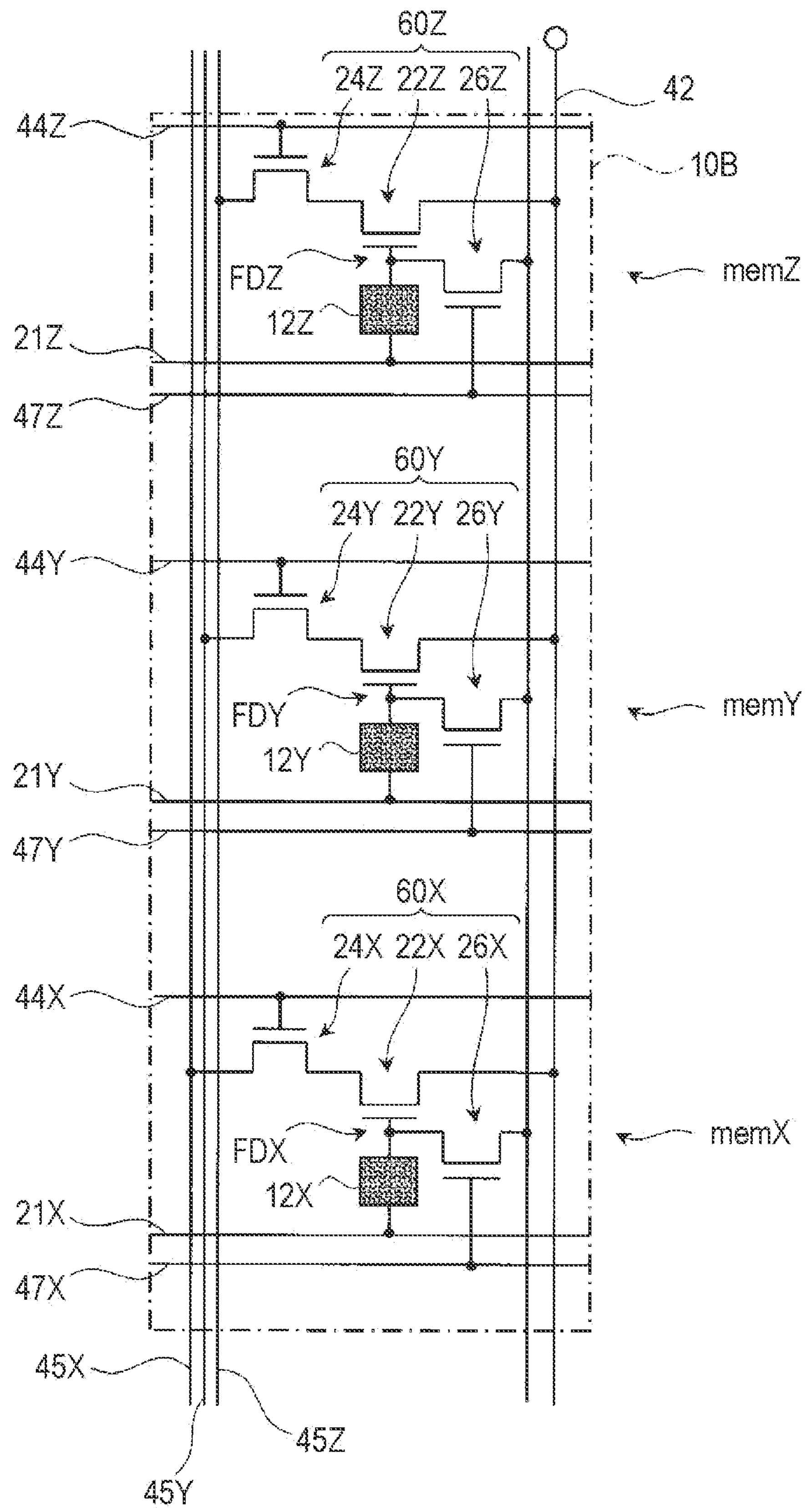
FIG. 10 is a schematic diagram of an imaging apparatus according to a second embodiment of the disclosure.

The number and layout of the pixels 10 are not limited to those illustrated in FIG. 10. For example, the number of the pixels 10 included in the imaging apparatus 100 may be one. Referring to FIG. 1, the center of each pixel 10 is arranged at a lattice point of a square lattice. Alternatively, the pixels 10 may be arranged such that the center of each pixel 10 is at a lattice point of a triangular lattice or a hexagonal lattice. For example, the imaging apparatus 100 may be utilized as a line sensor by arranging the pixels 10 one-dimensionally.

As illustrated in FIG. 1, the peripheral circuit includes a vertical scanning circuit 52 and a horizontal signal reading circuit 54. Referring to FIG. 1, the peripheral circuits may additionally include a control circuit 56 and a voltage supply circuit 58. The peripheral circuits may further include a signal processing circuit and an output circuit. Referring to FIG. 1, each circuit included in the peripheral circuits may be arranged on the semiconductor substrate 1. It is noted, however, that some of the peripheral circuits may be arranged on another substrate different from the substrate having the pixels 10 formed thereon.

The vertical scanning circuit 52 is also referred to as a row scanning circuit and connected to address signal lines 44, each of which is connected to a corresponding row of the pixels 10. As described later, a signal line arranged to a corresponding row of the pixels 10 is not limited to the address signal line 44. Multiple types of signal lines for the corresponding row of the pixels 10 may be connected to the vertical scanning circuit 52. The horizontal signal reading circuit 54 is also referred to a column scanning circuit and connected to the vertical signal line 45 arranged for the corresponding column of the pixels 10.

The control circuit 56 controls the entire imaging apparatus 100, for example, by receiving command data and clocks provided from the outside of the imaging apparatus 100. Typically, the control circuit 56 has a timing generator and supplies drive signals to the vertical scanning circuit 52, horizontal signal reading circuit 54, and voltage supply circuit 58. Referring to FIG. 1, arrow-headed lines extended from the control circuit 56 schematically illustrate the flows of output signals from the control circuit 56. The control circuit 56 may be implemented by a microcontroller, for example, including at least one processor. The function of the control circuit 56 may be implemented by a combination of a general-purpose processing circuit and software or by hardware that is specialized for the process described herein.

The voltage supply circuit 58 supplies a specific voltage to each pixel 10 via a voltage line 48. The voltage supply circuit 58 is not limited to any particular power supply circuit. For example, the voltage supply circuit 58 may be a circuit that converts a voltage from a power source, such as a battery, into the specific voltage or a circuit that generates the specific voltage. The voltage supply circuit 58 may be part of the vertical scanning circuit 52. As schematically illustrated in FIG. 1, these circuits forming the peripheral circuit are mounted in a periphery region R2 outside the imaging region R1.

Figure 2:
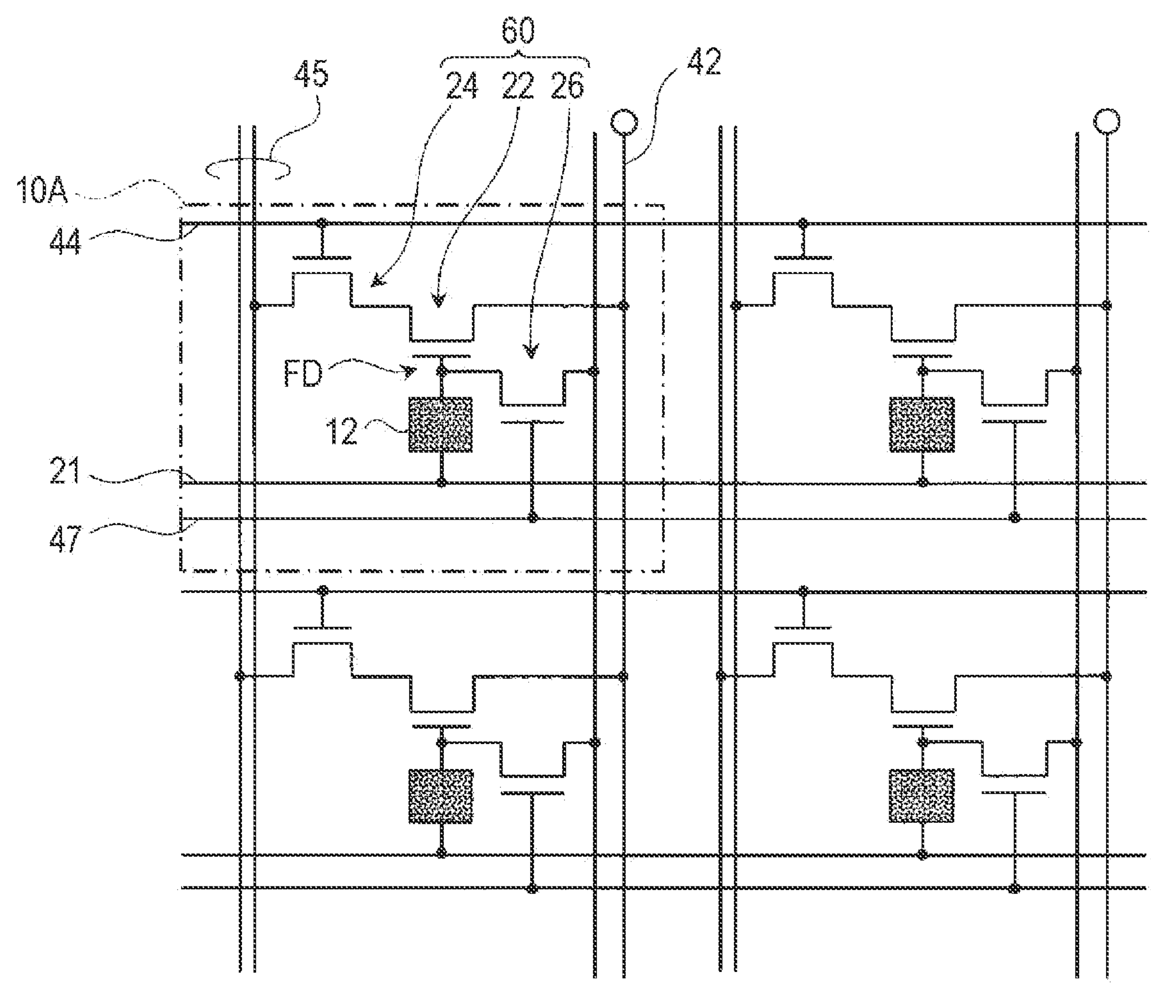
FIG. 2 is a schematic diagram of the imaging apparatus according to the first embodiment of the disclosure.

FIG. 2 schematically illustrates an exemplary circuit configuration of the imaging apparatus 100 according to the first embodiment of the disclosure. To circumvent the use of overcomplicated drawing, four pixels 10A arranged in two rows and two columns are illustrated in FIG. 2. Each of the pixels 10A is an example of the pixel 10 in FIG. 1 and includes a signal detecting circuit 60 that is electrically connected to the photoelectric converter 12 having the photoelectric conversion structure. As will be described in detail below with reference to the drawings, the photoelectric conversion structure includes a photoelectric conversion layer arranged above the semiconductor substrate 1. Specifically, a lamination type imaging apparatus is recited as the imaging apparatus 100. Also, a back-illuminated type imaging apparatus is recited as the imaging apparatus 100.

The vertical scanning circuit 52 is connected to a counter electrode power source line 21. In the first embodiment, the counter electrode power source line 21 may also be referred to as an accumulation control line.

The photoelectric converter 12 having the photoelectric conversion structure in each pixel 10A is connected to the counter electrode power source line 21. When the imaging apparatus 100 is in operation, the counter electrode power source line 21 is supplied with a specific voltage. For example, if positive charges out of the positive charges and negative charges generated via the photoelectric conversion are utilized, the counter electrode power source line 21 may be supplied with a positive voltage as high as about 10 V when the imaging apparatus 100 is in operation. According the first embodiment, holes are utilized as signal charges.

In the configuration illustrated in FIG. 2, one counter electrode power source line 21 is connected to one row of multiple pixels 10A. Alternatively, one counter electrode power source line 21 may be connected to multiple rows of multiple pixels 10A. Alternatively, one counter electrode power source line 21 may be connected to all pixels 10A in the imaging apparatus 100.

In the configuration illustrated in FIG. 2, the signal detecting circuit 60 includes a signal detecting transistor 22, address transistor 24, and reset transistor 26. The signal detecting transistor 22 may also be referred to as an amplifying transistor.

The signal detecting transistor 22, address transistor 24, and reset transistor 26 are typically field-effect transistors that are formed on or in the semiconductor substrate 1 supporting the photoelectric converter 12 having the photoelectric conversion structure. In the discussion that follows, the transistors are n-channel metal-oxide semiconductor field-effect (MOSFET) transistors unless otherwise noted.

As schematically illustrated in FIG. 2, a gate electrode 22*e* of the signal detecting transistor 22 is electrically connected to a charge accumulation region FD and photoelectric converter 12. By applying a specific voltage to the counter electrode power source line 21 in operation, holes may be accumulated as signal charges in the charge accumulation region FD. In the configuration illustrated in FIG. 2, the charge accumulation region FD is an impurity region formed in the semiconductor substrate 1. As illustrated in FIG. 2, the charge accumulation region FD has a function of temporarily storing the charges created via the photoelectric converter 12. The charge accumulation region FD may also be referred to as a floating diffusion region.

A drain of the signal detecting transistor 22 is connected to a power source wiring 42 that supplies a power source voltage VDD as high as about 3.3 V to each pixel 10A when the imaging apparatus 100 is in operation. A source of the signal detecting transistor 22 is connected to a vertical signal line 45 via the address transistor 24. The signal detecting transistor 22, supplied with the power source voltage VDD, outputs a signal voltage responsive to an amount of signal charges accumulated in the charge accumulation region FD.

An address signal line 44 is connected to agate electrode 24*e* of the address transistor 24 connected between the signal detecting transistor 22 and the vertical signal line 45. By applying to the address signal line 44, a row selection signal that controls the on-off operation of the address transistor 24, the vertical scanning circuit 52 may read the output of the signal detecting transistor 22 of the selected pixel 10A to a corresponding vertical signal line 45. The location of the address transistor 24 is not limited to the location illustrated in FIG. 2. For example, the signal detecting transistor 22 may be connected between the drain of the signal detecting transistor 22 and the power source wiring 42.

A reset signal line 47 connected to the vertical scanning circuit 52 is connected to a gate electrode 26*e* of the reset transistor 26. Like the address signal line 44, the reset signal line 47 is arranged on a per row basis of the pixels 10A. The vertical scanning circuit 52 may turn on the reset transistor 26 by applying to the gate electrode 26*e* of the reset transistor 26 via the reset signal line 47 a reset signal that controls the on-off operation of the reset transistor 26. When the reset transistor 26 is turned on, the potential of the charge accumulation region FD is reset.

Device Structure of Pixel 10A

Figure 3:
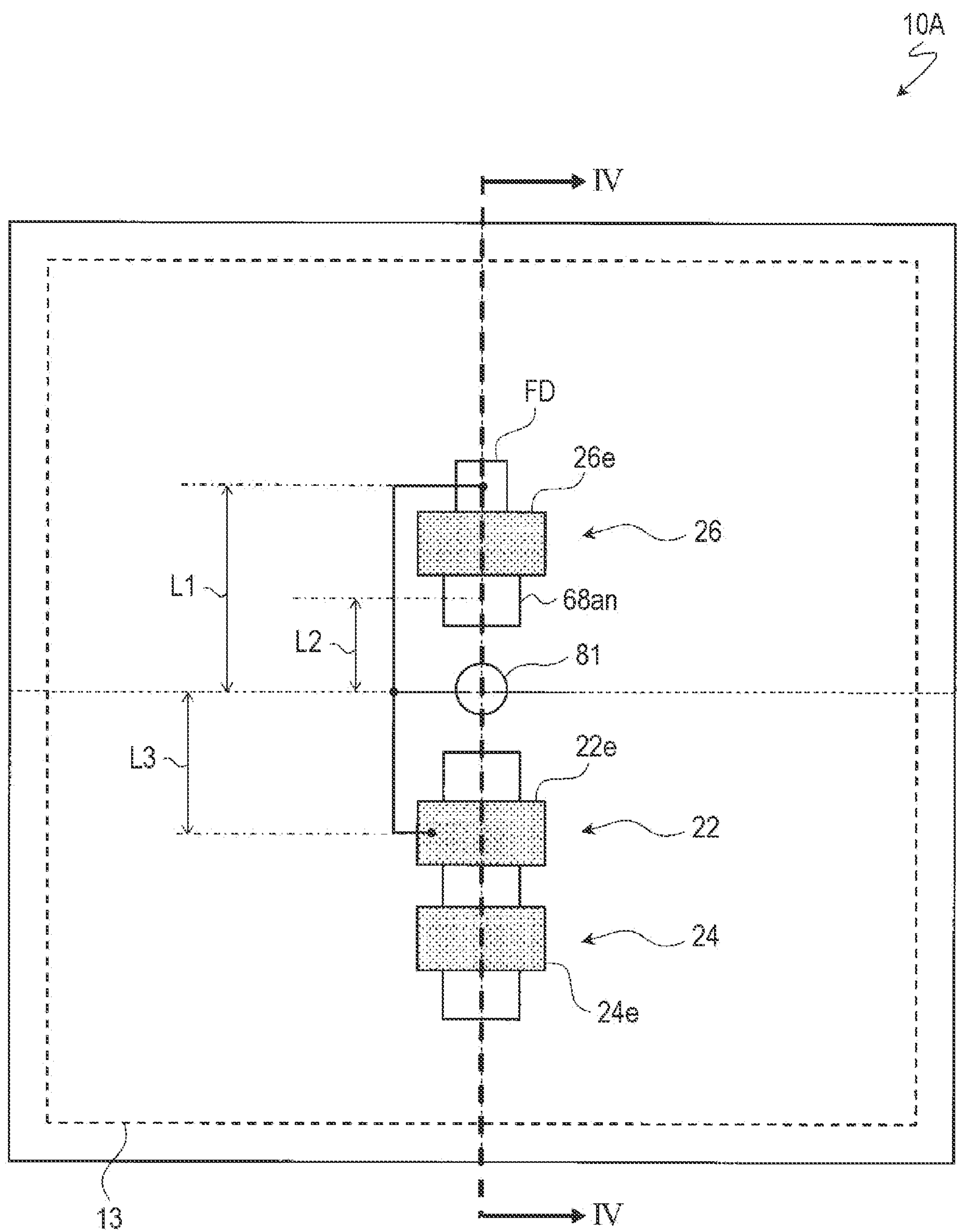
FIG. 3 is a plan view illustrating an example of a pixel according to the first embodiment of the disclosure.
Figure 4:
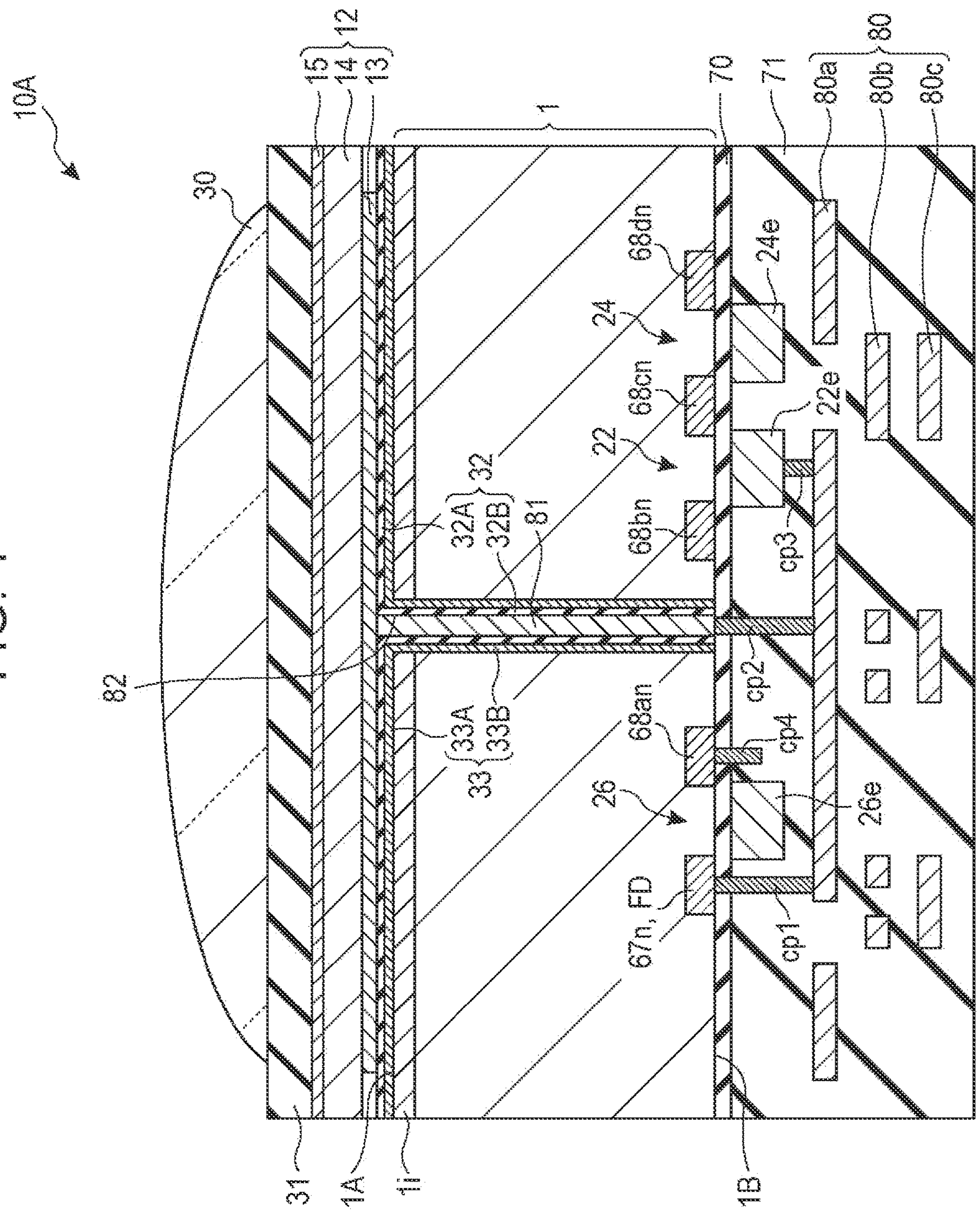
FIG. 4 is a cross-sectional view of an example of the pixel according to the first embodiment of the disclosure.

FIG. 3 illustrates the layout of the elements in the pixel 10A. FIG. 4 schematically illustrates an example of a device structure of the pixel 10A. FIG. 3 schematically illustrates the layout of the elements formed on or in the semiconductor substrate 1 if the pixel 10A in FIG. 4 is viewed in a direction normal to the semiconductor substrate 1. The cross-sectional view in FIG. 4 results if the pixel 10A is cut and viewed along a broken line IV-IV in FIG. 3.

In the discussion that follows, the term "first conduction type" is used. In the first embodiment, the first conduction type is an n-type and a second conduction type is a p-type. Alternatively, however, the first conduction type may be the p-type and the second conduction type may be the n-type.

Referring to FIGS. 3 and 4, the pixel 10A includes an insulation layer 71, insulation layer 70, semiconductor substrate 1, photoelectric converter 12, insulation layer 31, and microlens 30. The insulation layer 71, insulation layer 70, semiconductor substrate 1, photoelectric converter 12, insulation layer 31, and microlens 30 are laminated in this order. Specifically, these elements are laminated in the direction of the thickness of the semiconductor substrate 1. The pixel 10A also includes a penetrating electrode 81, dielectric layer 32, and fixed charge layer 33.

The semiconductor substrate 1 is, for example, a silicon substrate. The semiconductor substrate 1 has a first principal surface 1A and second principal surface 1B. The first principal surface 1A is a side on which light is incident. The second principal surface 1B is a side opposite to the light-incident side. In the first embodiment, the first principal surface 1A and second principal surface 1B are vertical to the direction of the thickness of the semiconductor substrate 1.

Referring to FIG. 4, the semiconductor substrate 1 includes an impurity region 1*i*. The impurity region 1*i* may be a p+ region or n+ region. The symbol "+" represents that the impurity concentration of the p-type or the n-type is higher. The impurity region 1*i* has the first principal surface 1A.

The reset transistor 26, signal detecting transistor 22, and address transistor 24 are arranged on or in the semiconductor substrate 1. Specifically, the reset transistor 26, signal detecting transistor 22, and address transistor 24 are mounted on the second principal surface 1B.

In the first embodiment, the reset transistor 26, signal detecting transistor 22, and address transistor 24 are MOSFETs. Specifically, the reset transistor 26, signal detecting transistor 22, and address transistor 24 are n-channel MOSFETs.

The reset transistor 26 includes one of the source and the drain thereof as a first diffusion region 67*n* serving as an example of a first impurity region. The reset transistor 26 also includes the other of the source and the drain thereof as a second diffusion region 68*an* serving as a second impurity region. The reset transistor 26 further includes a gate electrode 26*e* and insulation layer 70. The insulation layer 70 is interposed between the gate electrode 26*e* and the semiconductor substrate 1. The reset transistor 26 is an example of a first transistor.

The signal detecting transistor 22 includes one of the source and the drain thereof as a third diffusion region 68*bn*. The signal detecting transistor 22 includes the other of the source and the drain thereof as a fourth diffusion region 68*cn*. The signal detecting transistor 22 further includes a gate electrode 22*e* and insulation layer 70. The insulation layer 70 is interposed between the gate electrode 22*e* and the semiconductor substrate 1. The signal detecting transistor 22 is an example of a second transistor.

The address transistor 24 includes one of the source and the drain thereof as the fourth diffusion region 68*cn*. The address transistor 24 further includes the other of the source and the drain thereof as a fifth diffusion region 68*dn*. The address transistor 24 further includes a gate electrode 24*e* and insulation layer 70. The insulation layer 70 is interposed between the gate electrode 24*e* and the semiconductor substrate 1.

The first diffusion region 67*n*, second diffusion region 68*an*, third diffusion region 68*bn*, fourth diffusion region 68*cn*, and fifth diffusion region 68*dn* are located within the semiconductor substrate 1. The first diffusion region 67*n*, second diffusion region 68*an*, third diffusion region 68*bn*, fourth diffusion region 68*cn*, and fifth diffusion region 68*dn* contain an impurity of the first conduction type.

The first diffusion region 67*n* corresponds to the charge accumulation region FD. The first diffusion region 67*n* accumulates charges that the photoelectric converter 12 creates in response to light. The fourth diffusion region 68*cn* is shared by the signal detecting transistor 22 and the address transistor 24.

In the first embodiment, the first diffusion region 67*n* serves as the drain of the reset transistor 26. The second diffusion region 68*an* serves as the source of the reset transistor 26. The third diffusion region 68*bn* serves as the drain of the signal detecting transistor 22. The fourth diffusion region 68*cn* serves as the source of the signal detecting transistor 22 and the drain of the address transistor 24. The fifth diffusion region 68*dn* serves as the source of the address transistor 24.

The photoelectric converter 12 includes a pixel electrode 13, photoelectric conversion layer 14, and counter electrode 15. The counter electrode 15 faces the pixel electrode 13. The photoelectric conversion layer 14 is interposed between the pixel electrode 13 and the counter electrode 15.

The photoelectric conversion layer 14 has a film-like structure. The photoelectric conversion layer 14 contains at least one composition selected from the group consisting of an organic material and an inorganic material. For example, the inorganic material may be amorphous silicon. Upon receiving light via the counter electrode 15, the photoelectric conversion layer 14 creates positive and negative charges through photoelectric conversion. Typically, the photoelectric conversion layer 14 is formed across multiple pixels 10A. The photoelectric conversion layer 14 may contain a layer manufactured of an organic material and a layer manufactured of an inorganic material.

The counter electrode 15 is a transparent electrode. For example, the counter electrode 15 contains an electrically conductive transparent material, such as indium tin oxide (ITO). Typically, like the photoelectric conversion layer 14, the counter electrode 15 is formed across multiple pixels 10A.

The counter electrode 15 is connected to the counter electrode power source line 21 although the connection is not illustrated in FIG. 4. When the imaging apparatus 100 is in operation, the potential of the counter electrode 15 may be differentiated from the potential of the pixel electrode 13 by controlling the potential of the counter electrode power source line 21, and the pixel electrode 13 may collect signal charges created through the photoelectric conversion. For example, the potential of the counter electrode power source line 21 is controlled such that the potential of the photoelectric conversion layer 14 is higher than the potential of the pixel electrode 13. Specifically, a positive voltage as high as about 10 V is applied to the counter electrode power source line 21. In this way, the pixel electrode 13 may collect holes out of hole-electron pairs created in the photoelectric conversion layer 14. The signal charges collected by the pixel electrode 13 are diffused into the first diffusion region 67*n* via the penetrating electrode 81 and wiring structure 80.

The pixel electrode 13 contains at least one composition selected from the group consisting of a metal, metal nitride, and polysilicon. For example, the metal may be titanium, tantalum, or the like. The metal nitride may be titanium nitride, tantalum nitride, or the like. The polysilicon may be obtained by imparting conductivity to a polysilicon material through impurity doping. The pixel electrode 13 of interest is spatially separated from the pixel electrode 13 of a pixel 10A adjacent to the pixel electrode 13 of interest and is thus electrically isolated from the pixel electrode 13 of the adjacent pixel 10A.

The microlens 30 has a light condensing function. Light incident on the microlens 30 is supplied to the photoelectric converter 12. The photoelectric converter 12 thus converts the light supplied in this way.

The insulation layer 31 is interposed between the microlens 30 and the photoelectric converter 12. The insulation layer 31 functions as a protective layer that protects the photoelectric converter 12. The insulation layer 31 has a film-like structure.

The insulation layer 71 has the wiring structure 80. Referring to FIG. 4, the wiring structure 80 includes a first wiring layer 80*a*, second wiring layer 80*b*, and third wiring layer 80*c*.

Each of the first wiring layer 80*a*, second wiring layer 80*b*, and third wiring layer 80*c* typically contains at least one composition selected from the group consisting of a metal and a metallic compound. The metal may be copper, tungsten, or the like. The metallic compound may be metal nitride, metal oxide, or the like.

The insulation layer 71 includes a first contact plug cp1, second contact plug cp2, third contact plug cp3, and fourth contact plug cp4. The insulation layer 71 also includes the gate electrode 26*e*, gate electrode 22*e*, and gate electrode 24*e*.

Each of the first contact plug cp1, second contact plug cp2, third contact plug cp3, and fourth contact plug cp4 typically contains a semiconductor material. In the first embodiment, each of the first contact plug cp1, second contact plug cp2, third contact plug cp3, and fourth contact plug cp4 is a polysilicon layer that is doped with an impurity of the first conduction type. The semiconductor material contained in each of the first contact plug cp1, second contact plug cp2, third contact plug cp3, and fourth contact plug cp4 may be polycrystalline silicon, germanium, or the like. Each of the first contact plug cp1, second contact plug cp2, third contact plug cp3, and fourth contact plug cp4 may contain a metal in addition to or instead of the semiconductor material.

If the first contact plug cp1 contains a semiconductor material, an alloying reaction is less likely to occur in a contact interface between the charge accumulation region FD and the first contact plug cp1. In this way, crystal defects that could occur in the contact interface between the charge accumulation region FD and the first contact plug cp1 may be reduced, leading to a lower noise level.

In the first embodiment, the conduction type of the charge accumulation region FD is identical to the conduction type of the semiconductor material contained in the first contact plug cp1. In this way, a potential difference is less likely to occur between the charge accumulation region FD and the first contact plug cp1. As a result, a contact resistance between the charge accumulation region FD and the first contact plug cp1 may be reduced.

A through hole 82 is arranged in the semiconductor substrate 1. Specifically, openings are arranged in the first principal surface 1A and the second principal surface 1B and communicate with each other via the through hole 82. Specifically, the through hole 82 extends in the direction of the thickness of the semiconductor substrate 1.

The penetrating electrode 81 is arranged within the through hole 82. The penetrating electrode 81 may electrically connect elements that are separated by the semiconductor substrate 1 in the direction of the thickness of the semiconductor substrate 1.

The penetrating electrode 81 contains at least one composition selected from the group consisting of a metal and a metallic compound. For example, the metal may be copper, tungsten, or the like. The metallic compound may be metallic nitride, metal oxide, or the like. It is noted, however, that the penetrating electrode 81 may contain the same semiconductor material as a material contained in the semiconductor substrate 1 and may be doped with an impurity of the first or second conduction type. The semiconductor material that the semiconductor substrate 1 and the penetrating electrode 81 may contain may be silicon, polycrystalline silicon, germanium, or the like.

In one specific example, the pixel electrode 13 contains at least one of titanium nitride or tantalum nitride, and the penetrating electrode 81 contains copper. In this example, copper originated from the penetrating electrode 81 is less likely to diffuse in the pixel electrode 13.

The pixel electrode 13, penetrating electrode 81, second contact plug cp2, first wiring layer 80*a*, first contact plug cp1, and charge accumulation region FD are electrically connected in this order. The signal charges may be conveyed from the pixel electrode 13 to the charge accumulation region FD via the penetrating electrode 81, second contact plug cp2, first wiring layer 80*a*, and first contact plug cp1 in this order. According to the first embodiment, the holes as the signal charges may be conveyed from the pixel electrode 13 to the charge accumulation region FD via the penetrating electrode 81, second contact plug cp2, first wiring layer 80*a*, and first contact plug cp1 in this order.

The charge accumulation region FD, first contact plug cp1, first wiring layer 80*a*, third contact plug cp3, and gate electrode 22*e* of the signal detecting transistor 22 are electrically connected in this order. The signal charges may thus be conveyed from the charge accumulation region FD to the gate electrode 22*e* via the first contact plug cp1, first wiring layer 80*a*, and third contact plug cp3.

The second diffusion region 68*an* is electrically connected to the fourth contact plug cp4. Charges may thus be allowed to flow between the second diffusion region 68*an* and the fourth contact plug cp4. Wiring connected to the fourth contact plug cp4 is not illustrated.

The dielectric layer 32 has insulation properties. The dielectric layer 32 includes a first flat membrane region 32A and a first cylinder region 32B. The first flat membrane region 32A is interposed between the first principal surface 1A and the pixel electrode 13. The first cylinder region 32B is arranged surrounding the penetrating electrode 81.

The dielectric layer 32 contains at least one film selected from the group consisting of a silicon oxide film, a silicon nitride film, and a silicon oxynitride film. The dielectric layer 32 may contain tetraethoxysilane (TEOS).

The fixed charge layer 33 has fixed charges. The fixed charge layer 33 includes a second flat membrane region 33A and a second cylinder region 33B. The second flat membrane region 33A is interposed between the first principal surface 1A and the first flat membrane region 32A. The second cylinder region 33B is arranged surrounding the first cylinder region 32B.

The fixed charge layer 33 may have positive or negative fixed charges. A material of the layer having the negative fixed charges may be hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, aluminum nitride, hafnium oxynitride, aluminum oxynitride, or the like. The fixed charge layer 33 may have a laminate layer structure having two or more layers.

As described above, the imaging apparatus 100 of the first embodiment includes the pixels 10A. Each pixel 10A includes the pixel electrode 13 as a first electrode, counter electrode 15 as a second electrode, photoelectric conversion layer 14, semiconductor substrate 1 as a substrate, and penetrating electrode 81. The photoelectric conversion layer 14 is interposed between the pixel electrode 13 and the counter electrode 15. The photoelectric conversion layer 14 converts light into charges. The semiconductor substrate 1 includes the through hole 82 and the reset transistor 26 as a first transistor. The first diffusion region 67*n* serving as one of the source and the drain of the reset transistor 26 includes the charge accumulation region FD accumulating charges. The penetrating electrode 81 is arranged within the through hole 82. The penetrating electrode 81 electrically connects the pixel electrode 13 to the charge accumulation region FD.

The expression stating that "the penetrating electrode 81 is arranged within the through hole 82" is described further below. This expression signifies the concept that the penetrating electrode 81 extends within the through hole 82 by a shorter length than the through hole 82 in the direction of extension of the through hole 82. This expression also signifies the concept that the extension of the penetrating electrode 81 is identical to the extension of the through hole 82 in the direction of extension of the through hole 82. This expression further signifies the concept that the penetrating electrode 81 extends beyond the through hole 82 in the direction of extension of the through hole 82. According to the first embodiment, it is noted that the penetrating electrode 81 extends along at least part of the through hole 82.

The expression stating that "the penetrating electrode 81 electrically connects the pixel electrode 13 to the charge accumulation region FD" is described further below. This expression signifies the concept that the pixel electrode 13 is electrically connected to the charge accumulation region FD only by the penetrating electrode 81. This expression also signifies the concept that the pixel electrode 13 is electrically connected to the charge accumulation region FD by the penetrating electrode 81 and one or more other members. The same is true of any other similar expression.

According to the first embodiment, a substrate corresponds to the semiconductor substrate 1. The first electrode corresponds to the pixel electrode 13. The second electrode corresponds to the counter electrode 15. The first transistor corresponds to the reset transistor 26. The reset transistor 26 resets the potential of the charge accumulation region FD.

In the first embodiment, as illustrated in FIG. 3, a distance L1 between the charge accumulation region FD and the penetrating electrode 81 is longer in a plan view than a distance L2 between the other of the source and the drain of the reset transistor 26 serving as the second diffusion region 68*an* and the penetrating electrode 81. The relationship L1>L2 is appropriate to control the leakage current into the charge accumulation region FD. The leakage current may also be referred to as a dark current.

In the first embodiment, the first diffusion region 67*n* that is the one of the source and the drain of the reset transistor 26 is the charge accumulation region FD.

The reason why the relationship L1>L2 is appropriate to control the leakage current into the charge accumulation region FD is described below.

Crystal defects are typically present in a portion of the substrate surrounding the through hole 82. The crystal defects may lead to the occurrence of the leakage current into the charge accumulation region FD. The crystal defects may be created by a variety of causes.

In an example, the substrate is the semiconductor substrate 1 containing silicon and the through hole 82 is opened in the semiconductor substrate 1 using plasma etching. The surrounding portion about the through hole 82 in the semiconductor substrate 1 is exposed to plasma when the through hole 82 is opened. The crystal of silicon atoms in the surrounding portion is disturbed by ions having energy and is thus physically damaged. Crystal defects could thus be created in the surrounding portion. In this example, part of elements of an etching gas may be introduced into the semiconductor substrate 1 through ion collision. The crystal defects may thus be created by such introduced elements. In one specific example, the etching gas contains fluorine. Fluorine reacts with silicon of the semiconductor substrate 1, creating SiF. Etching is thus in progress. During etching, fluorine may be introduced into the surrounding portion about the through hole 82 in the semiconductor substrate 1. Fluorine diffuses in a heat treatment after the etching. This signifies that the crystal defects caused by fluorine are likely to cause the leakage current into the charge accumulation region FD.

The relationship L1>L2 easily allows a distance between a region where the crystal defects are present and the charge accumulation region FD. This may be beneficial in terms of reducing a pn-junction leakage current into the charge accumulation region FD attributed to the crystal defects.

The terms related to the relationship L1>L2 are described below.

The term "plan view" in the embodiments signifies a view of elements when the elements are viewed in the direction of the thickness of the semiconductor substrate 1. The direction of the thickness of the semiconductor substrate 1 may also be referred to as a normal direction to the semiconductor substrate 1.

A first definition of the first embodiment is that the distance L1 is a distance in a plan view between the geometric center of the charge accumulation region FD and the geometric center of the penetrating electrode 81 and that the distance L2 is a distance in a plan view between the geometric center of the other of the source and the drain of the reset transistor 26 serving as the second diffusion region 68*an* and the geometric center of the penetrating electrode 81.

As described above, the charge accumulation region FD, and the source and the drain are diffusion regions. According to the first definition of the first embodiment, the border of the diffusion region is a junction. The junction is a region where the concentration of the n-type impurity equals the concentration of the p-type impurity. According to the first definition of the first embodiment, the geometric center of the diffusion region in a plan view is determined based on the concept of the border. The concept of the geometric center of the diffusion region is true of the discussion that follows.

A second definition of the first embodiment is that the distance L1 is a distance in a plan view between the geometric center of a contact surface between the charge accumulation region FD and an electrode connected to the charge accumulation region FD and the geometric center of the penetrating electrode 81. Referring to FIG. 4, the electrode connected to the charge accumulation region FD is the first contact plug cp1. In the second definition, the distance L2 is a distance in a plan view between the geometric center of the penetrating electrode 81 and the geometric center of a contact surface between the second diffusion region 68*an* as the other of the source and the drain of the reset transistor 26 and an electrode connected to the second diffusion region 68*an*. As illustrated in FIG. 4, the electrode connected to the second diffusion region 68*an* is the fourth contact plug cp4.

In the first embodiment, if the relationship L1>L2 holds in accordance with at least one of the first definition or the second definition, the relationship L1>L2 applies.

In the first embodiment, the gate electrode 26*e* of the reset transistor 26 is located in a plan view between the penetrating electrode 81 and the charge accumulation region FD. This positional relationship is appropriate to restrict the leakage current into the charge accumulation region FD.

The reason why the positional relationship is appropriate to control the leakage current into the charge accumulation region FD is described below.

Firstly, the positional relationship may more easily assure a distance between a region where crystal defects are present and the charge accumulation region FD. For this reason, the positional relationship is appropriate to control the leakage current into the charge accumulation region FD.

Secondly, if the positional relationship is established, the leakage current into the charge accumulation region FD may be restricted by controlling a voltage applied to the gate electrode 26*e* of the reset transistor 26 serving as the first transistor. In an example, control to be performed by the imaging apparatus 100 includes negative bias control. The negative bias control maintains the state in which a negative bias is kept applied to the gate electrode 26*e* of the reset transistor 26 serving as the first transistor. The negative bias control sets, to an accumulation state, a portion of the second principal surface 1B of the semiconductor substrate 1 overlapping the gate electrode 26*e* in a plan view and a portion of the second principal surface 1B of the semiconductor substrate 1 overlapping the charge accumulation region FD in a plan view. By performing the negative bias control, a depletion layer in these portions may be reduced. This may lead to restricting the leakage current into the charge accumulation region FD. In the discussion above, the expression stating that the setting to the accumulation state signifies that an accumulation layer is formed in these portions. The accumulation layer refers to a layer where majority carriers have a higher density than in a region surrounding the accumulation layer. In the first embodiment, the majority carriers are positive charges, specifically, holes. Minority carriers are negative charges, specifically, electrons. In the negative bias control, a potential gradient from the gate electrode 26_e_ causes minority carriers from the penetrating electrode 81 to be more likely to travel within the semiconductor substrate 1 in a receding direction from the second principal surface 1B. This may also contribute to restricting the leakage current into the charge accumulation region FD. For example, the negative bias control is performed when the imaging apparatus 100 is in an operation mode to accumulate the signal charges in the charge accumulation region FD.

In the specific example described above, the first transistor is the reset transistor 26. The control to be performed by the imaging apparatus 100 includes reset control. The reset control resets the potential of the charge accumulation region FD by turning the reset transistor 26 on in response to the application of a positive voltage to the gate electrode 26_e_ of the reset transistor 26. The absolute value of the voltage applied to the gate electrode 26_e_ in the negative bias control is smaller than the value of the voltage applied to the gate electrode 26_e_ in the reset control.

The expression stating that "the gate electrode 26_e_ of the reset transistor 26 serving as the first transistor is located in a plan view between the penetrating electrode 81 and the charge accumulation region FD" is described further. According to the first definition of the first embodiment, this expression signifies that at least part of the gate electrode 26_e_ of the reset transistor 26 serving as the first transistor overlaps in a plan view at least part of a line segment connecting the geometric center of the penetrating electrode 81 to the geometric center of the charge accumulation region FD. According to the second definition of the first embodiment, this expression signifies that at least part of the gate electrode 26_e_ of the reset transistor 26 serving as the first transistor overlaps in a plan view at least part of a line segment connecting the geometric center of the penetrating electrode 81 to the geometric center of a contact surface between the charge accumulation region FD and an electrode connected to the charge accumulation region FD.

If the description stating that "the gate electrode 26_e_ of the reset transistor 26 serving as the first transistor is located in a plan view between the penetrating electrode 81 and the charge accumulation region FD" is effective according to at least one of the first definition or the second definition of the first embodiment, the description is treated as being established.

The imaging apparatus 100 of the first embodiment includes the signal detecting transistor 22 serving as the second transistor. The gate electrode 22_e_ of the signal detecting transistor 22 as the second transistor is electrically connected to the charge accumulation region FD.

The distance L1 between the charge accumulation region FD and the penetrating electrode 81 is longer in a plan view than a distance L3 between the gate electrode 22_e_ of the signal detecting transistor 22 as the second transistor and the penetrating electrode 81.

If the relationship L1>L3 holds, a distance is assured between the region where the crystal defects are present and the charge accumulation region FD while an electrical passage is more easily shortened between the gate electrode 22_e_ of the signal detecting transistor 22 as the second transistor and the penetrating electrode 81. The relationship L1>L3 restricts the leakage current into the charge accumulation region FD while being appropriate to control entrance of noise into the electrical passage between the gate electrode 22_e_ of the signal detecting transistor 22 as the second transistor and the penetrating electrode 81.

In the first embodiment, the second transistor corresponds to the signal detecting transistor 22.

In the first embodiment, the distance L3 is a distance in a plan view between the geometric center of the gate electrode 22_e_ of the signal detecting transistor 22 as the second transistor and the geometric center of the penetrating electrode 81.

In the first embodiment, an area S1 of the charge accumulation region FD is smaller in a plan view than an area S2 of the second diffusion region 68_an_ as the other of the source and the drain of the reset transistor 26 serving as the first transistor. The size relationship of the areas may reduce the probability that the carriers flow into the charge accumulation region FD from the penetrating electrode 81. The size relationship is thus appropriate to restrict the leakage current into the charge accumulation region FD.

According to the first definition of the first embodiment, the area S1 refers to an area of a region that expands inwardly in a plan view from a junction defining the charge accumulation region FD. The area S2 is an area of a region that expands inwardly in a plan view from a junction defining the second diffusion region 68_an_ as the other of the source and the drain of the reset transistor 26 serving as the first transistor.

In an example, the ratio of the area S1 to the area S2, namely, S1/S2, is ⅘ or less. The ratio S1/S2 may be ⅔ or less or ½ or less.

Alternatively, the area S1 may equal the area S2. Alternatively, the area S1 may be larger than the area S2.

In the first embodiment, the second cylinder region 33B of the fixed charge layer 33 is arranged surrounding the through hole 82. The second cylinder region 33B may restrict the leakage current, caused as a result of the crystal defects, into the charge accumulation region FD.

In the first embodiment, the pixel 10A includes a first electrical passage 83. The first electrical passage 83 electrically connects the penetrating electrode 81 to the charge accumulation region FD.

In the first embodiment, the first electrical passage 83 includes the second contact plug cp2, first wiring layer 80_a_, and first contact plug cp1.

FIGS. 5 through 8 illustrate examples of the first electrical passage 83.

Figure 5:
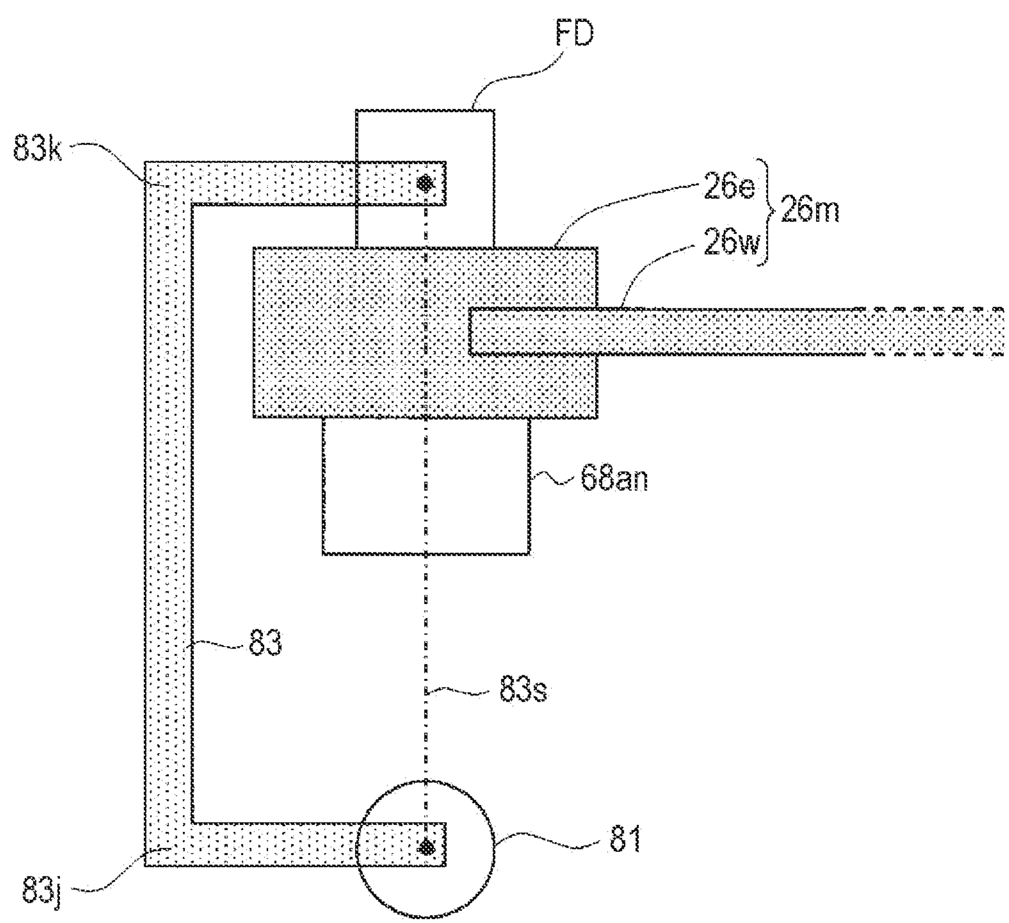
FIG. 5 illustrates an example of an electrical passage surrounding a penetrating electrode, charge accumulation region and gate electrode.
Figure 6:
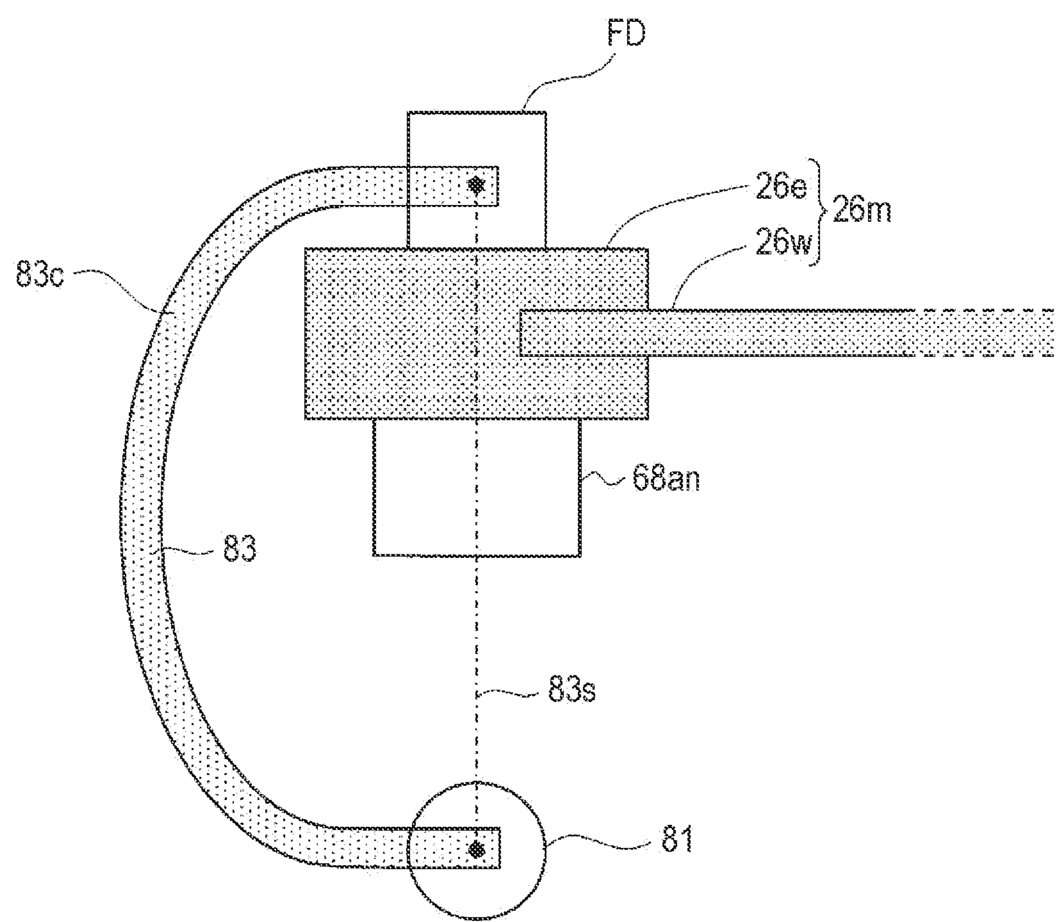
FIG. 6 illustrates an example of the electrical passage surrounding the penetrating electrode, charge accumulation region and gate electrode.
Figure 7:
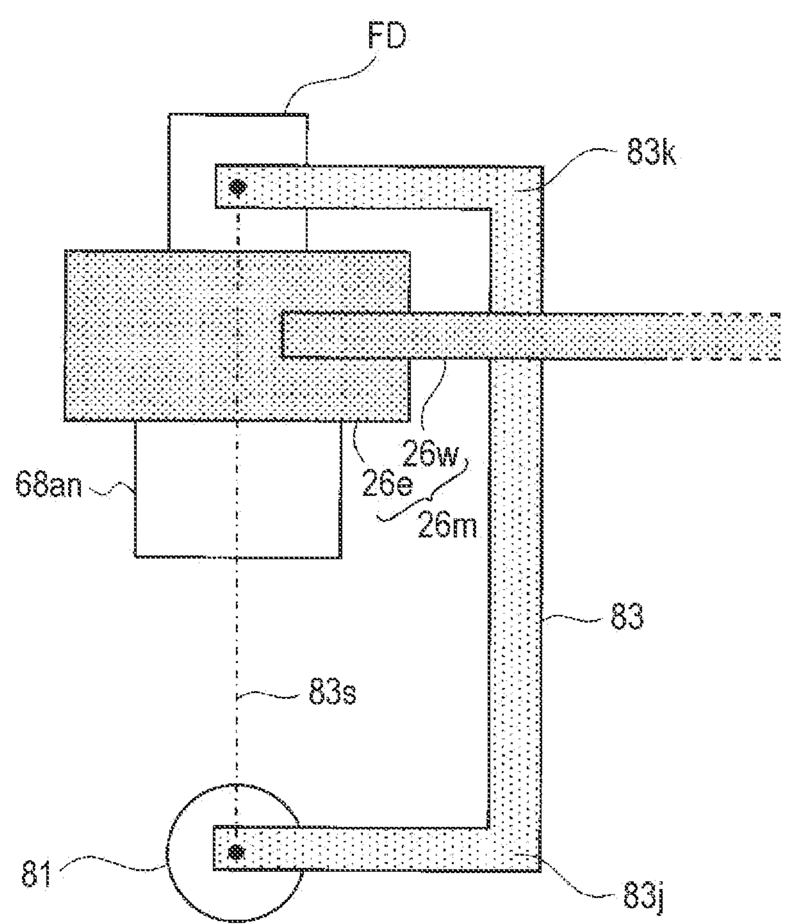
FIG. 7 illustrates an example of the electrical passage surrounding the penetrating electrode, charge accumulation region and gate electrode.

Referring to FIGS. 5 through 7, at least part of the first electrical passage 83 is bent in a plan view. In this way, the freedom of the layout of the electrical passage may be increased.

The expression stating that "at least part of the first electrical passage 83 is bent in a plan view" is described further. In the first embodiment, the expression signifies the concept that at least part of the first electrical passage 83 is bent or folded in a plan view as illustrated in FIGS. 5 and 7. Specifically, referring to FIGS. 5 and 7, the first electrical passage 83 is bent at a portion 83_j_ and a portion 83_k_ in a plan view. The expression also includes the concept that at least part of the first electrical passage 83 is mildly bend in a plan view as illustrated in FIG. 6. Specifically referring to FIG. 6, the first electrical passage 83 is mildly curved at a portion 83_c_ in a plan view.

In the first embodiment, the pixel 10A includes a gate wiring 26_w_. The gate wiring 26_w_ electrically connects to the gate electrode 26_e_ of the first transistor. In FIGS. 3 and 4, the gate wiring 26_w_ is not illustrated. In the example where the first transistor is the reset transistor 26, the gate wiring 26_w_ may include the reset signal line 47. Also in the example where the first transistor is the reset transistor 26, the gate wiring 26*w* may be the reset signal line 47.

The term "second electrical passage 26*m*" may be used. The second electrical passage 26*m* refers to a combination of the gate electrode 26*e* of the first transistor and the gate wiring 26*w*.

Referring to FIGS. 5 and 6, the first electrical passage 83 circumvents the second electrical passage 26*m* in a plan view. In this example, coupling between the first electrical passage 83 and the second electrical passage 26*m* may be restricted.

In the specific example in FIGS. 5 and 6, the first transistor is the reset transistor 26. Control to be performed by the imaging apparatus 100 includes reset control that resets the potential of the charge accumulation region FD by turning the reset transistor 26 on in response to the application of a voltage to the gate electrode 26*e* of the reset transistor 26. The voltage of the gate electrode 26*e* is changed in response to turn-on or turn-off after the turn-on of the reset transistor 26 in the reset control. Specifically, the voltage of the second electrical passage 26*m* is changed. If the voltage change occurs, coupling between the first electrical passage 83 and the second electrical passage 26*m* may vary the voltage of the first electrical passage 83 and the voltage of the charge accumulation region FD may vary in response to the variation in the voltage of the first electrical passage 83. Such a variation in the voltage of the charge accumulation region FD may become a cause for noise. However, if the first electrical passage 83 circumvents the second electrical passage 26*m*, the noise that could occur may be restricted.

The expression stating that "the first electrical passage 83 circumvents the second electrical passage 26*m* in a plan view" is further described. In the first embodiment, the expression indicates that at least part of a line segment 83*s* connecting the penetrating electrode 81 to the charge accumulation region FD overlaps at least part of the second electrical passage 26*m* in a plan view while the first electrical passage 83 is separated from the second electrical passage 26*m*. According to the first definition, the line segment 83*s* is a line segment that connects the geometric center of the penetrating electrode 81 to the geometric center of the charge accumulation region FD. According to the second definition, the line segment 83*s* is a line segment that connects the geometric center of the penetrating electrode 81 to the geometric center of a contact surface between the charge accumulation region FD and the electrode connected to the charge accumulation region FD.

Figure 8:
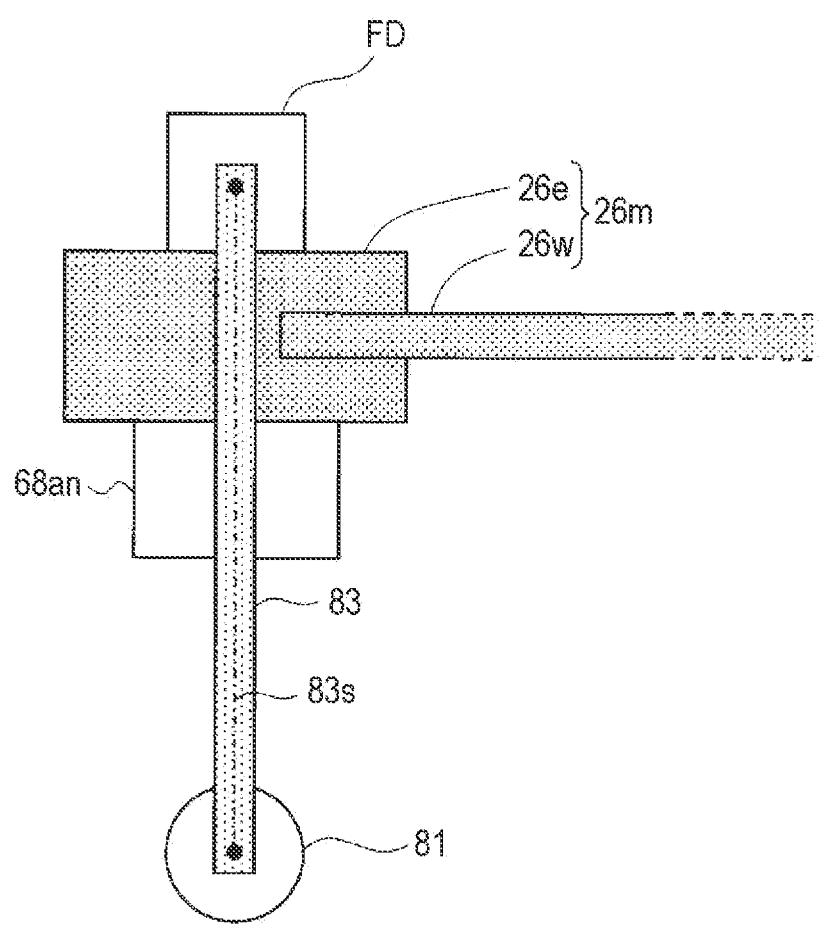
FIG. 8 illustrates an example of the electrical passage surrounding the penetrating electrode, charge accumulation region and gate electrode.

Referring to FIGS. 7 and 8, at least part of the first electrical passage 83 overlaps at least part of the second electrical passage 26*m* in a plan view. In the example illustrated in FIGS. 7 and 8, coupling may be created between the first electrical passage 83 and the second electrical passage 26*m*. The created coupling may lower the voltage of the charge accumulation region FD, thereby restricting the leakage current into the charge accumulation region FD.

Referring to FIG. 7, at least part of the first electrical passage 83 is bent in a plan view. Referring to FIG. 8, the first electrical passage 83 extends linearly in a plan view. As illustrated in FIG. 8 as well as in FIG. 7, at least part of the first electrical passage 83 may overlap at least part of the second electrical passage 26*m* in a plan view.

In the first embodiment, as illustrated in FIG. 3, at least part of the pixel electrode 13 serving as the first electrode overlaps at least part of the charge accumulation region FD in a plan view. With this arrangement, the pixel electrode 13 may restrict the irradiation of light onto the charge accumulation region FD. This arrangement may be beneficial in terms of restricting the leakage current into the charge accumulation region FD.

Specifically, in the first embodiment, as illustrated in FIG. 3, the entire charge accumulation region FD overlaps part of the pixel electrode 13 serving as the first electrode in a plan view.

In the first embodiment, the pixel electrode 13 serving as the first electrode contains at least one of a metal or a metallic compound. In this way, the pixel electrode 13 having the leakage current restriction effect may be implemented.

In the first embodiment, the pixel electrode 13 serving as the first electrode contains a metal. In this way, the pixel electrode 13 having the leakage current restriction effect may be more easily implemented.

In the first embodiment, the pixel electrode 13 serving as the first electrode contains a material that has at least one of a feature that the pixel electrode 13 serving as the first electrode is lower in light transmittance than the semiconductor substrate 1 or a feature that the pixel electrode 13 serving as the first electrode is lower in light transmittance than ITO. These features may be beneficial in terms of ensuring the leakage current restriction effect. In this context, the light transmittance refers to at least one of visible light transmittance or near infrared light transmittance. The wavelength of visible light ranges from 400 nm to 780 nm. The wavelength of near infrared light ranges from 780 nm to 2000 nm. The light transmittance may be calculated via the method defined in Japanese Industrial Standard JIS R3106 (1998).

In the first embodiment, no photodiode is arranged within the semiconductor substrate 1. In a manner free from considering the irradiation of the photodiode with light, design restricting the light irradiation onto the charge accumulation region FD by overlapping at least part of the pixel electrode 13 serving as the first electrode on at least part of the charge accumulation region FD in a plan view may be more easily available. However, even when photodiodes are arranged in the semiconductor substrate 1, the design restricting the light irradiation onto the charge accumulation region FD by overlapping at least part of the pixel electrode 13 serving as the first electrode on at least part of the charge accumulation region FD in a plan view may be employed.

Figure 9:
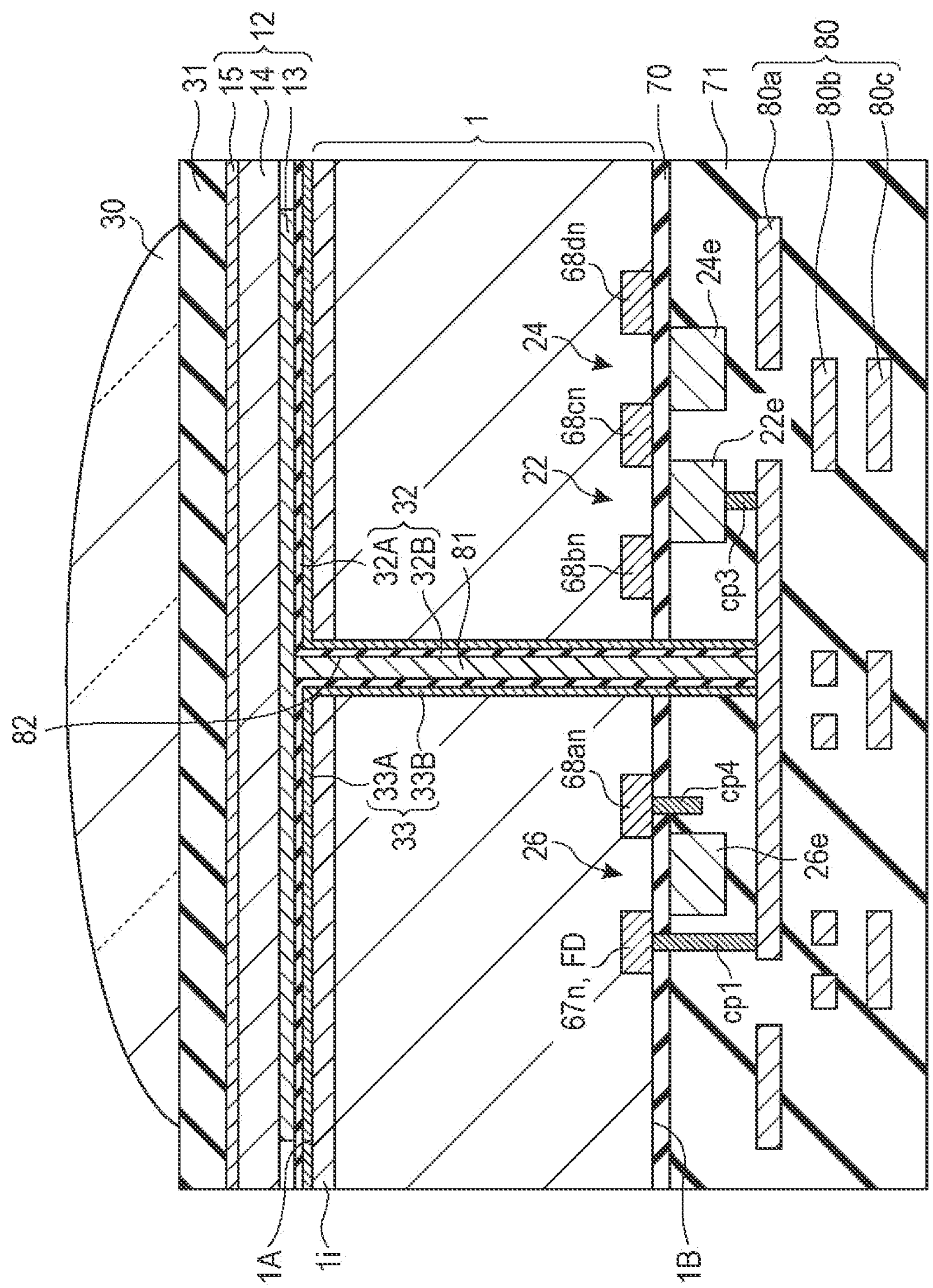
FIG. 9 illustrates an example of a direct connection between the penetrating electrode and electrode structure.

In the first embodiment, the second contact plug cp2 is located between the penetrating electrode 81 and the first wiring layer 80*a* as illustrated in FIG. 4. Alternatively, the penetrating electrode 81 may be directly connected to the first wiring layer 80*a* as illustrated in FIG. 9. The same is true of the other embodiments described below.

The first embodiment includes multiple pixels 10A. The same is true of the other embodiments described below.

The other embodiments are described below. In the discussion that follows, elements common to the first embodiments and other embodiments are designated with the same reference numerals and the discussion thereof is not repeated. The discussion of one embodiment is applicable to the discussion of another embodiment as long as the discussions are technically consistent to each other. The embodiments may be combined with each other as long as such a combination is technically consistent.

Second Embodiment

Figure 11:
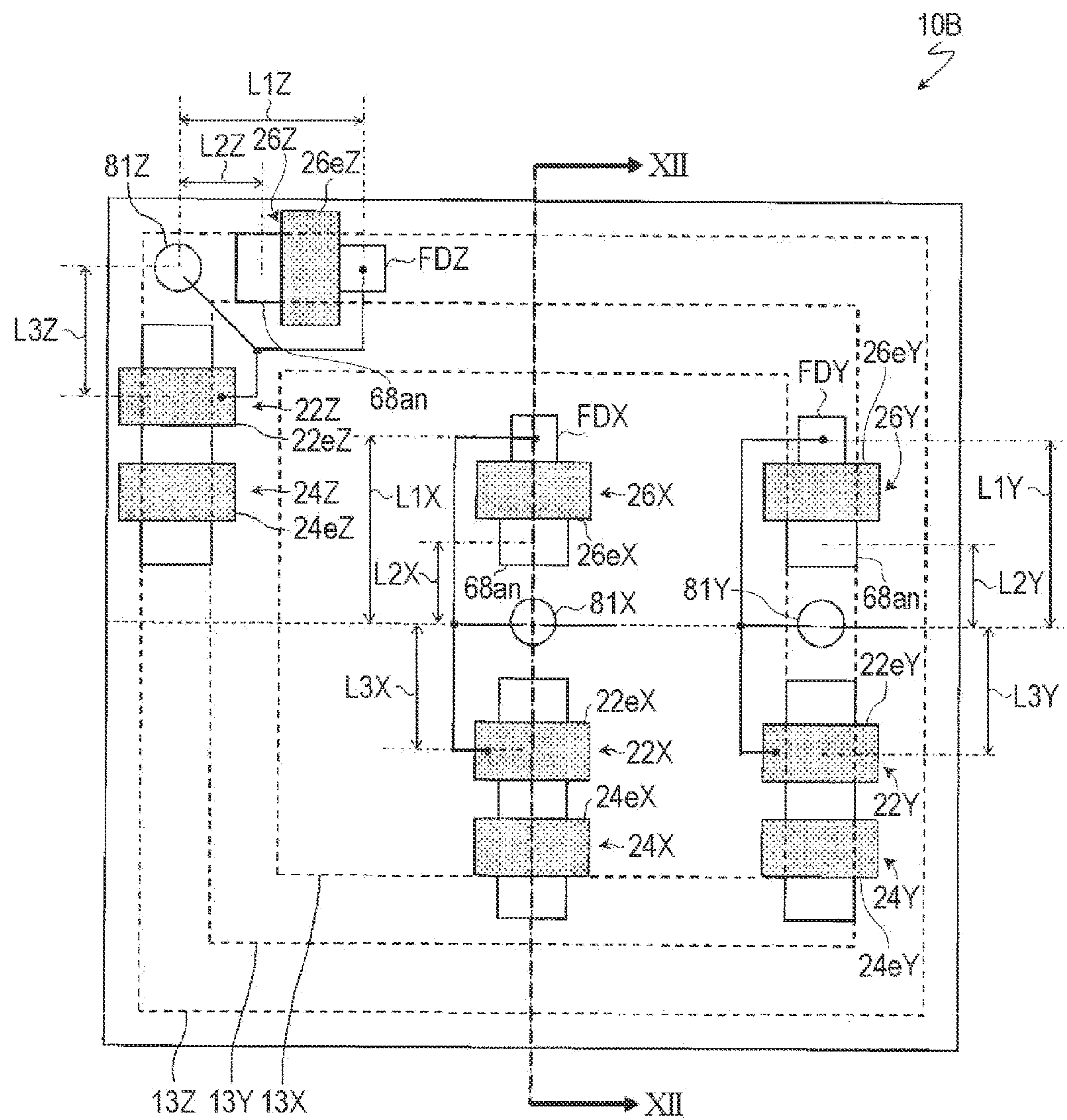
FIG. 11 is a plan view illustrating an example of a pixel according to the second embodiment of the disclosure.
Figure 12:
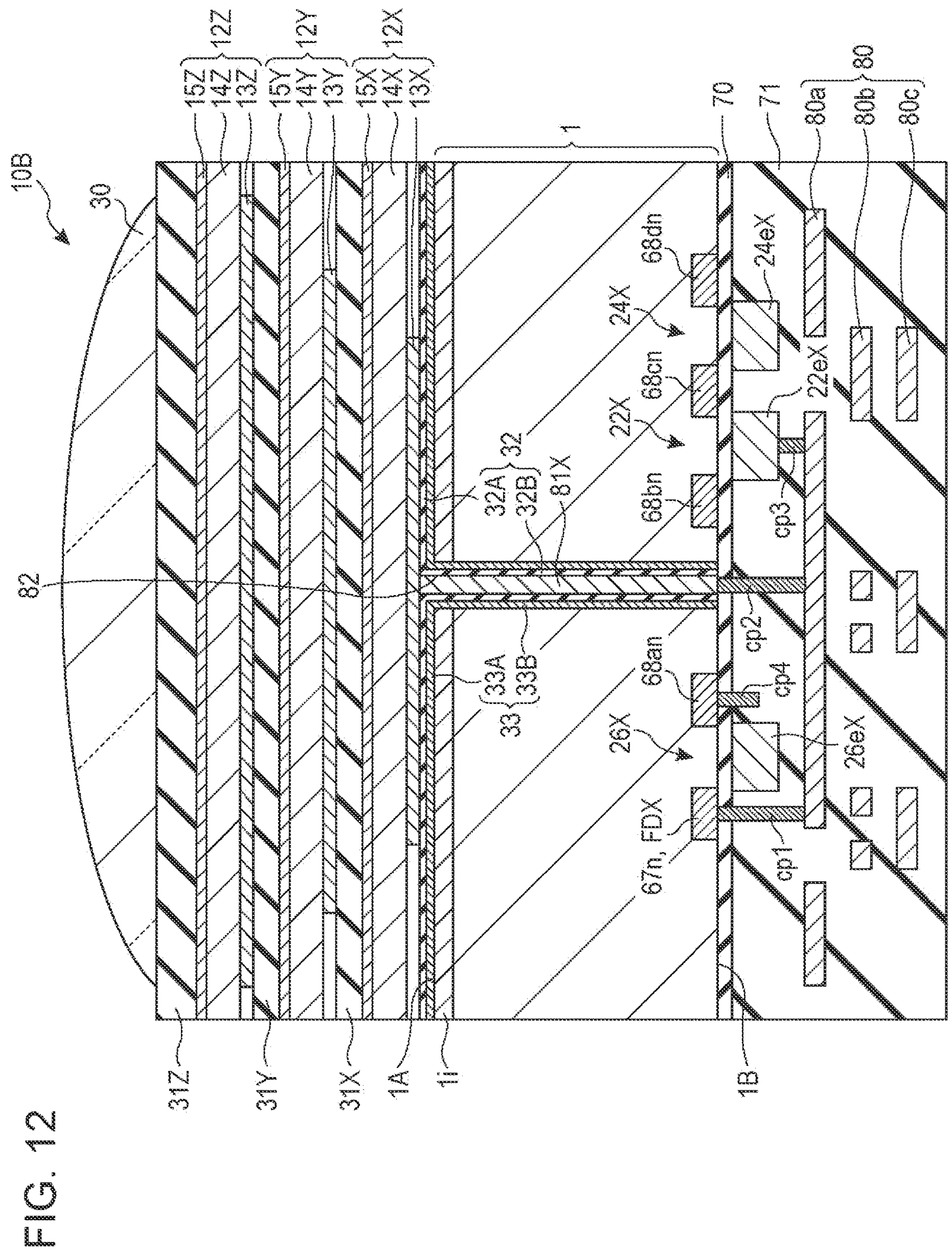
FIG. 12 is a cross-sectional view illustrating an example of the pixel according to the second embodiment of the disclosure.

FIG. 10 illustrates an exemplary circuit configuration of a pixel 10B. FIG. 12 illustrates an example of a device structure of the pixel 10B. FIG. 11 schematically illustrates the layout of elements formed on or in the semiconductor substrate 1 when the pixel 10B in FIG. 12 is viewed along a line normal to the semiconductor substrate 1. If the pixel 10B is cut and displayed along a broken line XII-XII in FIG. 11, the cross-sectional view in FIG. 12 results.

A second embodiment is different from the first embodiment in that the second embodiment includes three photoelectric conversion layers. The three photoelectric conversion layers have sensitivities responsive to light rays in wavelength ranges of mutually different colors. Specifically, the three photoelectric conversion layers have sensitivities responsive to light rays in the wavelength ranges of red (R), green (G), and blue (B). According to the second embodiment, the photoelectric conversion layers having optimized sensitivities responsive to the light rays in the wavelength ranges of these colors are utilized. The second embodiment may be beneficial in terms of improving photoelectric conversion efficiency.

The second embodiment is described in detail.

Referring to FIG. 10, the pixel 10B includes three combinations, each including the photoelectric converter 12, penetrating electrode 81, signal detecting circuit 60, and charge accumulation region FD. The three combinations are also referred to as a first combination memX, second combination memY, and third combination memZ.

In the second embodiment, the photoelectric converter 12, penetrating electrode 81, signal detecting circuit 60, and charge accumulation region FD in the first combination memX are respectively occasionally referred to as a photoelectric converter 12X, penetrating electrode 81X, signal detecting circuit 60X, and charge accumulation region FDX. The pixel electrode 13, photoelectric conversion layer 14, and counter electrode 15 of the photoelectric converter 12X are respectively occasionally referred to as a pixel electrode 13X, photoelectric conversion layer 14X, and counter electrode 15X. The signal detecting transistor 22, address transistor 24, and reset transistor 26 of the signal detecting circuit 60X are respectively occasionally referred to as a signal detecting transistor 22X, address transistor 24X, and reset transistor 26X. The gate electrode 22*e* of the signal detecting transistor 22X, gate electrode 24*e* of the address transistor 24X, and gate electrode 26*e* of the reset transistor 26X are respectively occasionally referred to as a gate electrode 22*e*X, gate electrode 24*e*X, and gate electrode 26*e*X.

In the second embodiment, the photoelectric converter 12, penetrating electrode 81, signal detecting circuit 60, and charge accumulation region FD in the second combination memY are respectively occasionally referred to as a photoelectric converter 12Y, penetrating electrode 81Y, signal detecting circuit 60Y, and charge accumulation region FDY. The pixel electrode 13, photoelectric conversion layer 14, and counter electrode 15 of the photoelectric converter 12Y are respectively occasionally referred to as a pixel electrode 13Y, photoelectric conversion layer 14Y, and counter electrode 15Y. The signal detecting transistor 22, address transistor 24, and reset transistor 26 of the signal detecting circuit 60Y are respectively occasionally referred to as a signal detecting transistor 22Y, address transistor 24Y, and reset transistor 26Y. The gate electrode 22*e* of the signal detecting transistor 22Y, gate electrode 24*e* of the address transistor 24Y, and gate electrode 26*e* of the reset transistor 26Y are respectively occasionally referred to as a gate electrode 22*e*Y, gate electrode 24*e*Y, and gate electrode 26*e*Y.

In the second embodiment, the photoelectric converter 12, penetrating electrode 81, signal detecting circuit 60, and charge accumulation region FD in the third combination memZ are respectively occasionally referred to as a photoelectric converter 12Z, penetrating electrode 81Z, signal detecting circuit 60Z, and charge accumulation region FDZ. The pixel electrode 13, photoelectric conversion layer 14, and counter electrode 15 of the photoelectric converter 12Z are respectively occasionally referred to as a pixel electrode 13Z, photoelectric conversion layer 14Z, and counter electrode 15Z. The signal detecting transistor 22, address transistor 24, and reset transistor 26 of the signal detecting circuit 60Z are respectively occasionally referred to as a signal detecting transistor 22Z, address transistor 24Z, and reset transistor 26Z. The gate electrode 22*e* of the signal detecting transistor 22Z, the gate electrode 24*e* of the address transistor 24Z, and the gate electrode 26*e* of the reset transistor 26Z are respectively occasionally referred to as a gate electrode 22*e*Z, gate electrode 24*e*Z, and gate electrode 26*e*Z.

Each of the first combination memX, second combination memY, and third combination memZ may include other elements, such as those explained in connection with the first embodiment. Each of the first combination memX, second combination memY, and third combination memZ may be related to other elements, such as those explained in connection with the first embodiment. The elements in each of the first combination memX, second combination memY, and third combination memZ may have the same features as the corresponding elements in the first embodiment.

As illustrated in FIG. 12, in the second embodiment, the penetrating electrode 81X in the first combination memX is arranged in the through hole 82 of the first combination memX. The penetrating electrode 81Y in the second combination memY is arranged in the through hole 82 of the second combination memY though the penetrating electrode 81Y is not illustrated. The penetrating electrode 81Z in the third combination memZ is arranged in the through hole 82 of the third combination memZ though the penetrating electrode 81Z is not illustrated.

According to the second embodiment, as illustrated in FIG. 12, the pixel electrode 13X, penetrating electrode 81X, second contact plug cp2 for the first combination memX, first wiring layer 80*a*, first contact plug cp1 for the first combination memX, and charge accumulation region FDX are connected in this order in the first combination memX. In the second combination memY as well, a similar connection is made using the second contact plug cp2 and the first contact plug cp1 for the second combination memY though such connection is not illustrated. In the third combination memZ as well, a similar connection is made using the second contact plug cp2 and the first contact plug cp1 for the third combination memZ.

In the second embodiment, as illustrated in FIG. 12, the photoelectric converter 12X and the penetrating electrode 81X in the first combination memX are related to the dielectric layer 32 and the fixed charge layer 33 in the first combination memX. As seen from FIGS. 4 and 12, these elements are related in the same way as the photoelectric converter 12, penetrating electrode 81, dielectric layer 32, and fixed charge layer 33 in the first embodiment are related. The same is true of the second combination memY and the third combination memZ though corresponding elements are not illustrated.

In the second embodiment, an insulation layer 31X corresponding to the insulation layer 31 in the first embodiment is arranged above the photoelectric converter 12X in the first combination memX. An insulation layer 31Y corresponding to the insulation layer 31 in the first embodiment is arranged above the photoelectric converter 12Y in the second combination memY. A insulation layer 31Z corresponding to the insulation layer 31 in the first embodiment is arranged above the photoelectric converter 12Z in the third combination memZ.

In the first embodiment, the insulation layer 71, insulation layer 70, semiconductor substrate 1, photoelectric converter 12X, insulation layer 31X, photoelectric converter 12Y, insulation layer 31Y, photoelectric converter 12Z, insulation layer 31Z, and microlens 30 are laminated in this order. Specifically, these elements are laminated in the direction of the thickness of the semiconductor substrate 1.

In the second embodiment, the first combination memX, second combination memY, and third combination memZ share the insulation layer 71, insulation layer 70, wiring structure 80, and semiconductor substrate 1.

According to the second embodiment, the photoelectric conversion layer 14X in the first combination memX has a sensitivity to the wavelength range of red (R). The photoelectric conversion layer 14Y in the second combination memY has a sensitivity to the wavelength range of green (G). The photoelectric conversion layer 14Z in the third combination memZ has a sensitivity to the wavelength range of blue (B). In the second embodiment, the photoelectric conversion layer having a sensitivity to red light, the photoelectric conversion layer having a sensitivity to green light, and the photoelectric conversion layer having a sensitivity to blue light are laminated in this order. However, the order of lamination of the photoelectric conversion layers is not limited to any particular order.

In the second embodiment, the outer edge of the pixel electrode 13Y is located inside the outer edge of the pixel electrode 13Z in a plan view. The outer edge of the pixel electrode 13X is located inside the outer edge of the pixel electrode 13Y in a plan view.

In the second embodiment, the horizontal signal reading circuit 54 is connected to vertical signal lines 45X, vertical signal lines 45Y, and vertical signal lines 45Z.

In the second embodiment, the vertical scanning circuit 52 is connected to address signal lines 44X, address signal lines 44Y, and address signal lines 44Z. The vertical scanning circuit 52 is connected to counter electrode power source lines 21X, counter electrode power source lines 21Y, and counter electrode power source lines 21Z. The vertical scanning circuit 52 is connected to reset signal lines 47X, reset signal lines 47Y, and reset signal lines 47Z.

In the second embodiment, the vertical signal line 45X, address signal line 44X, counter electrode power source line 21X, reset signal line 47X, signal detecting circuit 60X, photoelectric converter 12X, and charge accumulation region FDX are related to each other in the same way as the vertical signal line 45, address signal line 44, counter electrode power source line 21, reset signal line 47, signal detecting circuit 60, photoelectric converter 12, and charge accumulation region FD in the first embodiment are related to each other. The same is true of the vertical signal line 45Y, address signal line 44Y, counter electrode power source line 21Y, reset signal line 47Y, signal detecting circuit 60Y, photoelectric converter 12Y, and charge accumulation region FDY. The same is true of the vertical signal line 45Z, address signal line 44Z, counter electrode power source line 21Z, reset signal line 47Z, signal detecting circuit 60Z, photoelectric converter 12Z, and charge accumulation region FDZ.

In the second embodiment, the photoelectric converter 12X is connected to the counter electrode power source line 21X. The photoelectric converter 12Y is connected to the counter electrode power source line 21Y. The photoelectric converter 12Z is connected to the counter electrode power source line 21Z.

Specifically, the counter electrode 15X is connected to the counter electrode power source line 21X. The counter electrode 15Y is connected to the counter electrode power source line 21Y. The counter electrode 15Z is connected to the counter electrode power source line 21Z.

The reset signal line 47X is connected to the gate electrode 26*e*X of the reset transistor 26X. The reset signal line 47Y is connected to the gate electrode 26*e*Y of the reset transistor 26Y. The reset signal line 47Z is connected to the gate electrode 26*e*Z of the reset transistor 26Z.

The positional relationship in a plan view in the first embodiment is also established in the second embodiment as well.

In the second embodiment, in the first combination memX as illustrated in FIG. 11, a distance L1X between the charge accumulation region FDX and the penetrating electrode 81X is longer in a plan view than a distance L2X between the penetrating electrode 81X and the second diffusion region 68*an* serving as the other of the source and the drain of the reset transistor 26X serving as the first transistor. In the second embodiment, the first transistor corresponds to the reset transistor 26X.

In the second embodiment, in the second combination memY, a distance L1Y between the charge accumulation region FDY and the penetrating electrode 81Y is longer in a plan view than a distance L2Y between the penetrating electrode 81Y and the second diffusion region 68*an* serving as the other of the source and the drain of the reset transistor 26Y serving as the first transistor. In the second embodiment, the first transistor corresponds to the reset transistor 26Y.

In the second embodiment, in the third combination memZ, a distance L1Z between the charge accumulation region FDZ and the penetrating electrode 81Z is longer in a plan view than a distance L2Z between the penetrating electrode 81Z and the second diffusion region 68*an* serving as the other of the source and the drain of the reset transistor 26Z serving as the first transistor. In the second embodiment, the first transistor corresponds to the reset transistor 26Z.

In the second embodiment, the gate electrode 26*e*X of the reset transistor 26X is located between the penetrating electrode 81X and the charge accumulation region FDX in a plan view in the first combination memX.

In an example, control to be performed by the imaging apparatus 100 includes first negative bias control. The first negative bias control is performed to maintain the state in which a voltage is kept applied to the gate electrode 26*e*X of the reset transistor 26X serving as the first transistor. In the first negative bias control, a portion of the second principal surface 1B of the semiconductor substrate 1 overlapping the gate electrode 26*e*X in a plan view and a portion of the second principal surface 1B of the semiconductor substrate 1 overlapping part of the charge accumulation region FDX in a plan view may be set to an accumulation state. The first negative bias control is performed when the imaging apparatus 100 is in an operation mode to accumulate signal charges in the charge accumulation region FD.

The first transistor is, for example, the reset transistor 26X. Control to be performed by the imaging apparatus 100 includes first reset control. The first reset control resets the potential of the charge accumulation region FDX by turning the reset transistor 26X on in response to the application of a positive voltage to the gate electrode 26eX of the reset transistor 26X. The absolute value of the voltage applied to the gate electrode 26eX in the first negative bias control is smaller than the value of the voltage applied to the gate electrode 26eX in the first reset control.

In the second embodiment, in the second combination memY, the gate electrode 26eY of the reset transistor 26Y serving as the first transistor is located between the penetrating electrode 81Y and the charge accumulation region FDY in a plan view.

In an example, control to be performed by the imaging apparatus 100 includes second negative bias control. The second negative bias control maintains the state in which a voltage is kept applied to the gate electrode 26eY of the reset transistor 26Y serving as the first transistor. In the second negative vias control, a portion of the second principal surface 1B of the semiconductor substrate 1 overlapping the gate electrode 26eY in a plan view and a portion of the second principal surface 1B of the semiconductor substrate 1 overlapping the charge accumulation region FDY in a plan view may be set to the accumulation state. The second negative bias control is performed when the imaging apparatus 100 is in an operation mode to accumulate signal charges in the charge accumulation region FD.

In a specific example, the first transistor is the reset transistor 26Y. Control to be performed by the imaging apparatus 100 includes second reset control. The second reset control resets the potential of the charge accumulation region FDY by turning the reset transistor 26Y on in response to the application of a positive voltage to the gate electrode 26eY of the reset transistor 26Y. The absolute value of the voltage applied to the gate electrode 26eY in the second negative bias control is smaller than the value of the voltage applied to the gate electrode 26eY in the second reset control.

In the second embodiment, in the third combination memZ, the gate electrode 26eZ of the reset transistor 26Z serving as the first transistor is located between the penetrating electrode 81Z and the charge accumulation region FDZ in a plan view.

In an example, control to be performed by the imaging apparatus 100 includes third negative bias control. The third negative bias control maintains the state in which a voltage is kept applied to the gate electrode 26eZ of the reset transistor 26Z serving as the first transistor. In the third negative vias control, a portion of the second principal surface 1B of the semiconductor substrate 1 overlapping the gate electrode 26eZ in a plan view and a portion of the second principal surface 1B of the semiconductor substrate 1 overlapping the charge accumulation region FDZ in a plan view may be set to the accumulation state. The third negative bias control is performed when the imaging apparatus 100 is in an operation mode to accumulate signal charges in the charge accumulation region FD.

In a specific example, the first transistor is the reset transistor 26Z. Control to be performed by the imaging apparatus 100 includes third reset control. The third reset control resets the potential of the charge accumulation region FDZ by turning the reset transistor 26Z in response to the application of a positive voltage to the gate electrode 26eZ of the reset transistor 26Z. The absolute value of the voltage applied to the gate electrode 26eZ in the third negative bias control is smaller than the value of the voltage applied to the gate electrode 26eZ in the third reset control.

According to the second embodiment, in the first combination memX, the distance L1X between the charge accumulation region FDX and the penetrating electrode 81X is longer in a plan view than a distance L3X between the gate electrode 22eX of the signal detecting transistor 22X serving as the second transistor and the penetrating electrode 81X. In the second embodiment, the second transistor corresponds to the signal detecting transistor 22X.

According to the second embodiment, in the second combination memY, the distance L1Y between the charge accumulation region FDY and the penetrating electrode 81Y is in a plan view longer than a distance L3Y between the gate electrode 22eY of the signal detecting transistor 22Y serving as the second transistor and the penetrating electrode 81Y. In the second embodiment, the second transistor corresponds to the signal detecting transistor 22Y.

According to the second embodiment, in the third combination memZ, the distance L1Z between the charge accumulation region FDZ and the penetrating electrode 81Z is longer in a plan view than a distance L3Z between the gate electrode 22eZ of the signal detecting transistor 22Z serving as the second transistor and the penetrating electrode 81Z. In the second embodiment, the second transistor corresponds to the signal detecting transistor 22Z.

According to the second embodiment, in the first combination memX, an area S1X of the charge accumulation region FDX is smaller in a plan view than an area S2X of the second diffusion region 68an as the other of the source and the drain of the reset transistor 26X serving as the first transistor. A ratio of the area SIX to the area S2X, S1X/S2X, may be ⅘ or less, ⅔ or less, or ½ or less. The area SIX may equal the area S2X. The area SIX may be larger than the area S2X.

According to the second embodiment, in the second combination memY, an area S1Y of the charge accumulation region FDY is smaller in a plan view than an area S2Y of the second diffusion region 68an as the other of the source and the drain of the reset transistor 26Y serving as the first transistor. A ratio of the area S1Y to the area S2Y, S1Y/S2Y, may be ⅘ or less, ⅔ or less, or ½ or less. The area S1Y may equal the area S2Y. The area S1Y may be larger than the area S2Y.

According to the second embodiment, in the third combination memZ, an area S1Z of the charge accumulation region FDZ is smaller in a plan view than an area S2Z of the second diffusion region 68an as the other of the source and the drain of the reset transistor 26Z serving as the first transistor. A ratio of the area S1Z to the area S2Z, S1Z/S2Z, may be ⅘ or less, ⅔ or less, or ½ or less. The area S1Z may equal the area S2Z. The area S1Z may be larger than the area S2Z.

The first electrical passage 83, penetrating electrode 81X, and charge accumulation region FDX in the first combination memX may be related to each other in the same way as the first electrical passage 83, penetrating electrode 81, and charge accumulation region FD in the first embodiment are related to each other.

The first electrical passage 83, penetrating electrode 81Y, and charge accumulation region FDY in the second combination memY may be related to each other in the same way as the first electrical passage 83, penetrating electrode 81, and charge accumulation region FD in the first embodiment are related to each other.

The first electrical passage 83, penetrating electrode 81Z, and charge accumulation region FDZ in the third combination memZ may be related to each other in the same way as the first electrical passage 83, penetrating electrode 81, and charge accumulation region FD in the first embodiment are related to each other.

The gate wiring 26*w* in the first combination memX may be electrically connected to the gate electrode 26*e*X of the first transistor. With the first transistor being the reset transistor 26X, a gate wiring 26*w*X in the first combination memX may correspond to the reset signal line 47X.

The gate wiring 26*w* in the second combination memY may be electrically connected to the gate electrode 26*e*Y of the first transistor. With the first transistor being the reset transistor 26Y, a gate wiring 26*w*Y in the first combination memX may correspond to the reset signal line 47Y.

The gate wiring 26*w* in the third combination memZ may be electrically connected to the gate electrode 26*e*Z of the first transistor. With the first transistor being the reset transistor 26Z, a gate wiring 26*w*Z in the first combination memX may correspond to the reset signal line 47Z.

In an example, the first electrical passage 83 in the first combination memX circumvents the second electrical passage 26*m* in the first combination memX in a plan view. The second electrical passage 26*m* in the first combination memX refers to a combination of the gate electrode 26*e*X of the first transistor and the gate wiring 26*w* in the first combination memX.

In an example, the first electrical passage 83 in the second combination memY circumvents the second electrical passage 26*m* in the second combination memY in a plan view. The second electrical passage 26*m* in the second combination memY refers to a combination of the gate electrode 26*e*Y of the first transistor and the gate wiring 26*w* in the second combination memY.

In an example, the first electrical passage 83 in the third combination memZ circumvents the second electrical passage 26*m* in the third combination memZ in a plan view. The second electrical passage 26*m* in the third combination memZ refers to a combination of the gate electrode 26*e*Z of the first transistor and the gate wiring 26*w* in the third combination memZ.

In an example, at least part of the first electrical passage 83 in the first combination memX overlaps the second electrical passage 26*m* in the first combination memX in a plan view.

In an example, at least part of the first electrical passage 83 in the second combination memY overlaps the second electrical passage 26*m* in the second combination memY in a plan view.

In an example, at least part of the first electrical passage 83 in the third combination memZ overlaps the second electrical passage 26*m* in the third combination memZ in a plan view.

In the second embodiment, at least part of the pixel electrode 13X serving as the first electrode in the first combination memX overlaps at least part of the charge accumulation region FDX in the first combination memX in a plan view. The whole area of the charge accumulation region FDX may overlap at least part of the pixel electrode 13X serving as the first electrode in a plan view.

In the second embodiment, at least part of the pixel electrode 13Y serving as the first electrode in the second combination memY overlaps at least part of the charge accumulation region FDY in the second combination memY in a plan view. The whole area of the charge accumulation region FDY may overlap at least part of the pixel electrode 13Y serving as the first electrode in a plan view.

In the second embodiment, at least part of the pixel electrode 13Z serving as the first electrode in the third combination memZ overlaps at least part of the charge accumulation region FDZ in the third combination memZ in a plan view. The whole area of the charge accumulation region FDZ may overlap at least part of the pixel electrode 13Z serving as the first electrode in a plan view.

In the second embodiment, light transmittance of the pixel electrode 13X serving as the first electrode in the first combination memX may be lower than light transmittance of the pixel electrode 13Y serving as the first electrode in the second combination memY and light transmittance of the pixel electrode 13Z serving as the first electrode in the third combination memZ above the semiconductor substrate 1.

Third Embodiment

Figure 13:
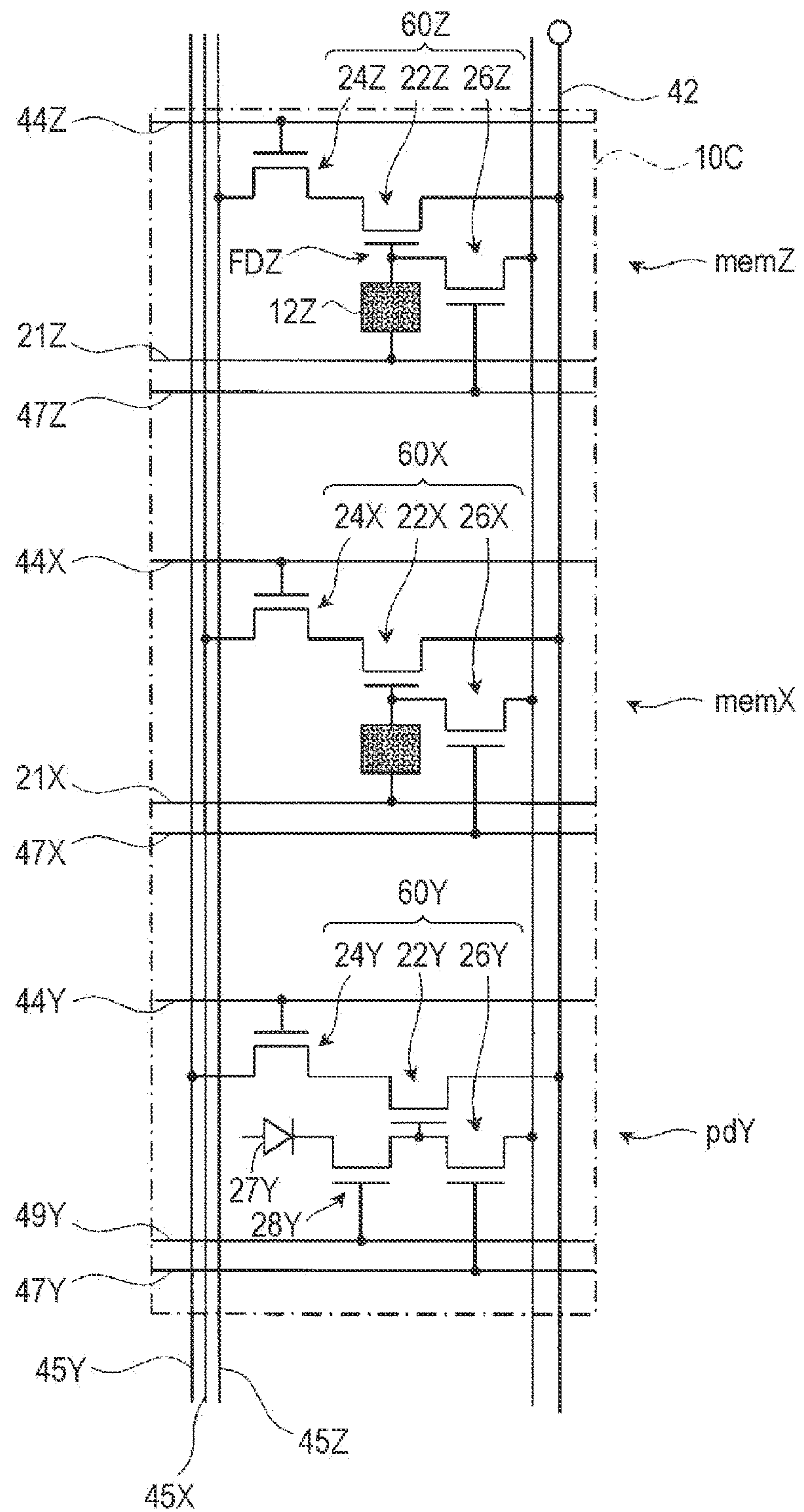
FIG. 13 is a schematic diagram illustrating an example of an imaging apparatus according to a third embodiment of the disclosure.
Figure 14:
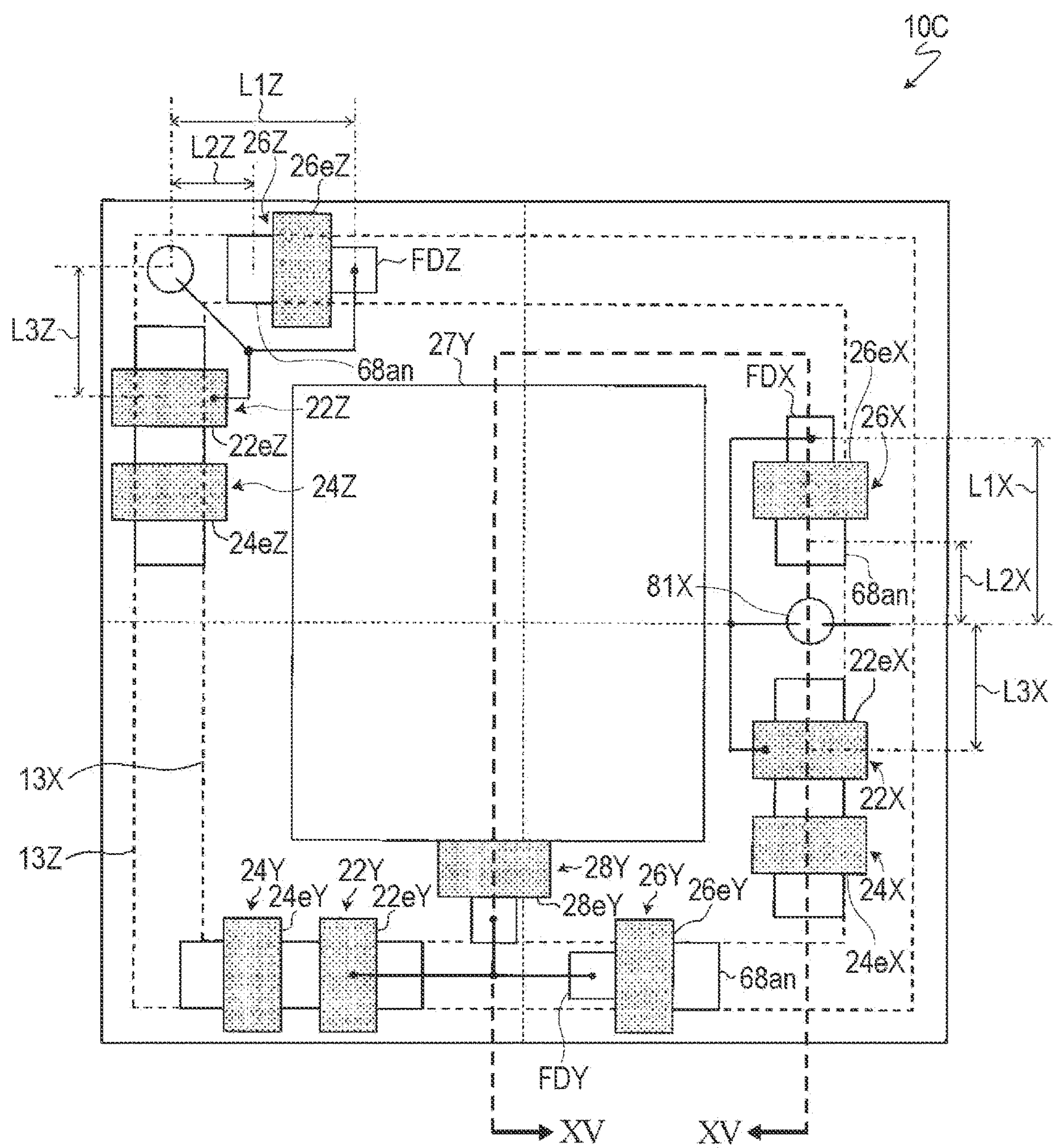
FIG. 14 is a plan view illustrating an example of a pixel according to the third embodiment of the disclosure.
Figure 15:
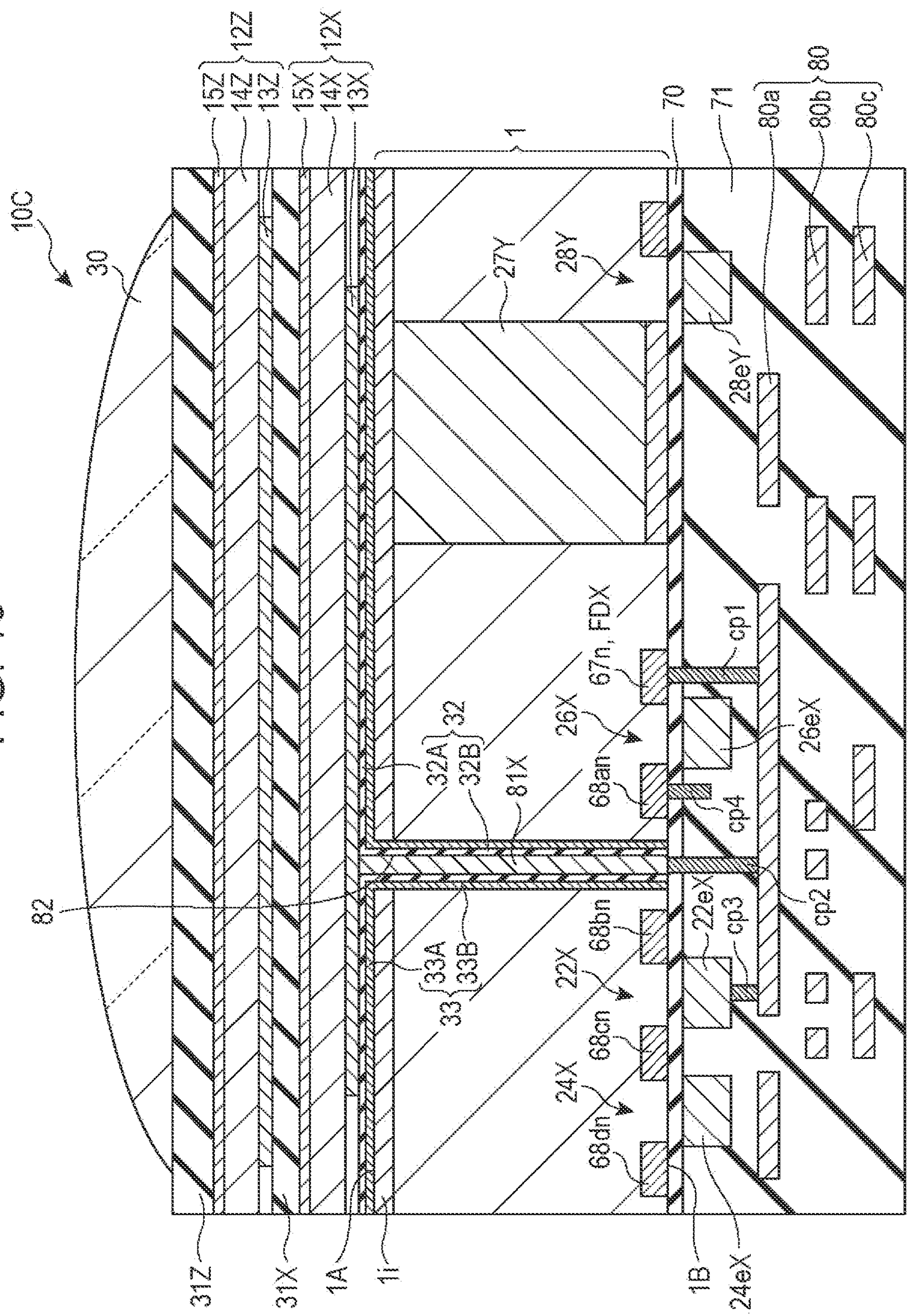
FIG. 15 is a cross-sectional view illustrating a pixel according to the third embodiment of the disclosure.

FIG. 13 illustrates an exemplary circuit configuration of a pixel 10C. FIG. 15 illustrates an example of a device structure of the pixel 10C. FIG. 14 schematically illustrates the layout of elements formed on or in the semiconductor substrate 1 when the pixel 10C in FIG. 15 is viewed along a line normal to the semiconductor substrate 1. If the pixel 10C is cut and displayed along a broken line XV-XV in FIG. 14, the cross-sectional view in FIG. 15 results.

Unlike in the second embodiment, two photoelectric conversion layers are laminated in a third embodiment. Typically, the two photoelectric conversion layers have sensitivities to light rays in wavelength ranges of different colors. Specifically, the two photoelectric conversion layers have sensitivities to light rays in the wavelength ranges of red (R) and blue (B). In the third embodiment, the photoelectric conversion layers having appropriate sensitivities to light rays in the wavelength ranges of these colors may be employed. The third embodiment may be beneficial in terms of improving the freedom of the design of photoelectric conversion film materials.

Unlike the second embodiment, the third embodiment includes a photodiode within the semiconductor substrate 1. Typically, the photodiode photoelectrically converts light rays in a wavelength that are not absorbed by the two photoelectric conversion layers. Specifically, the photodiode converts light rays in the wavelength range of green (G).

According to the third embodiment, the two photoelectric conversion layers and one photodiode have sensitivities to light rays in the wavelength ranges of three different colors. This configuration may be implemented without utilizing a color filter.

The third embodiment is described in detail below.

Like in the first embodiment, as illustrated in FIG. 13, the pixel 10C in the third embodiment includes the first combination memX and the third combination memZ. Unlike in the second embodiment, the pixel 10C includes a second combination pdY.

Like the second combination memY, the second combination pdY includes a signal detecting circuit 60Y. Unlike the second combination memY, the second combination pdY includes a photodiode 27Y and transfer transistor 28Y.

In the third embodiment, the insulation layer 71, insulation layer 70, semiconductor substrate 1, photoelectric converter 12X, insulation layer 31X, photoelectric converter 12Z, insulation layer 31Z, and microlens 30 are laminated in this order. Specifically, these elements are laminated in the direction of the thickness of the semiconductor substrate 1.

In the third embodiment, the outer edge of the pixel electrode 13X is located inside the outer edge of the pixel electrode 13Z in a plan view.

The photodiode 27Y has a sensitivity to light rays. Specifically, the photodiode 27Y is arranged within the semiconductor substrate 1. The photodiode 27Y photoelectrically converts light rays in the wavelength range of green (G) that is not absorbed by the photoelectric converters 12X and 12Z.

The photodiode 27Y, when irradiated with light, creates charges. The created charges are accumulated as signal charges in the photodiode 27Y. Unlike in the preceding embodiments, the signal charges are negative charges in the third embodiment. Specifically, the signal charges are electrons. The photodiode 27Y is an n-type impurity layer.

Change of the conduction type of the impurity region and adjustments of each element involved in the change of the polarity of the signal charges may be appropriately performed. Also, the change of terms involved in the change of the polarity of the signal charges may be appropriately performed.

The transfer transistor 28Y is arranged at the semiconductor substrate 1. Specifically, the transfer transistor 28Y is arranged on the second principal surface 1B.

The transfer transistor 28Y is a MOSFET. Specifically, the transfer transistor 28Y is an n-channel MOSFET.

The transfer transistor 28Y transfers the signal charges accumulated in the photodiode 27Y to the charge accumulation region FDY. In the third embodiment as well as in the second embodiment, the charge accumulation region FDY is the first diffusion region 67*n* that is one of the source and the drain of the reset transistor 26Y serving as the first transistor.

A transfer signal line 49Y connected to the vertical scanning circuit 52 is connected to a gate electrode 28*e*Y of the transfer transistor 28Y. Like the address signal line 44Y, the transfer signal line 49Y is arranged on each row of multiple pixels 10C. The vertical scanning circuit 52 turns the transfer transistor 28Y on by applying, to the gate electrode 28*e*Y of the transfer transistor 28Y via the transfer signal line 49Y, a transfer signal that controls the on-off operation of the transfer transistor 28Y. With the transfer transistor 28Y turned on, the signal charges accumulated in the photodiode 27Y are transferred to the charge accumulation region FDY.

Fourth Embodiment

Figure 16:
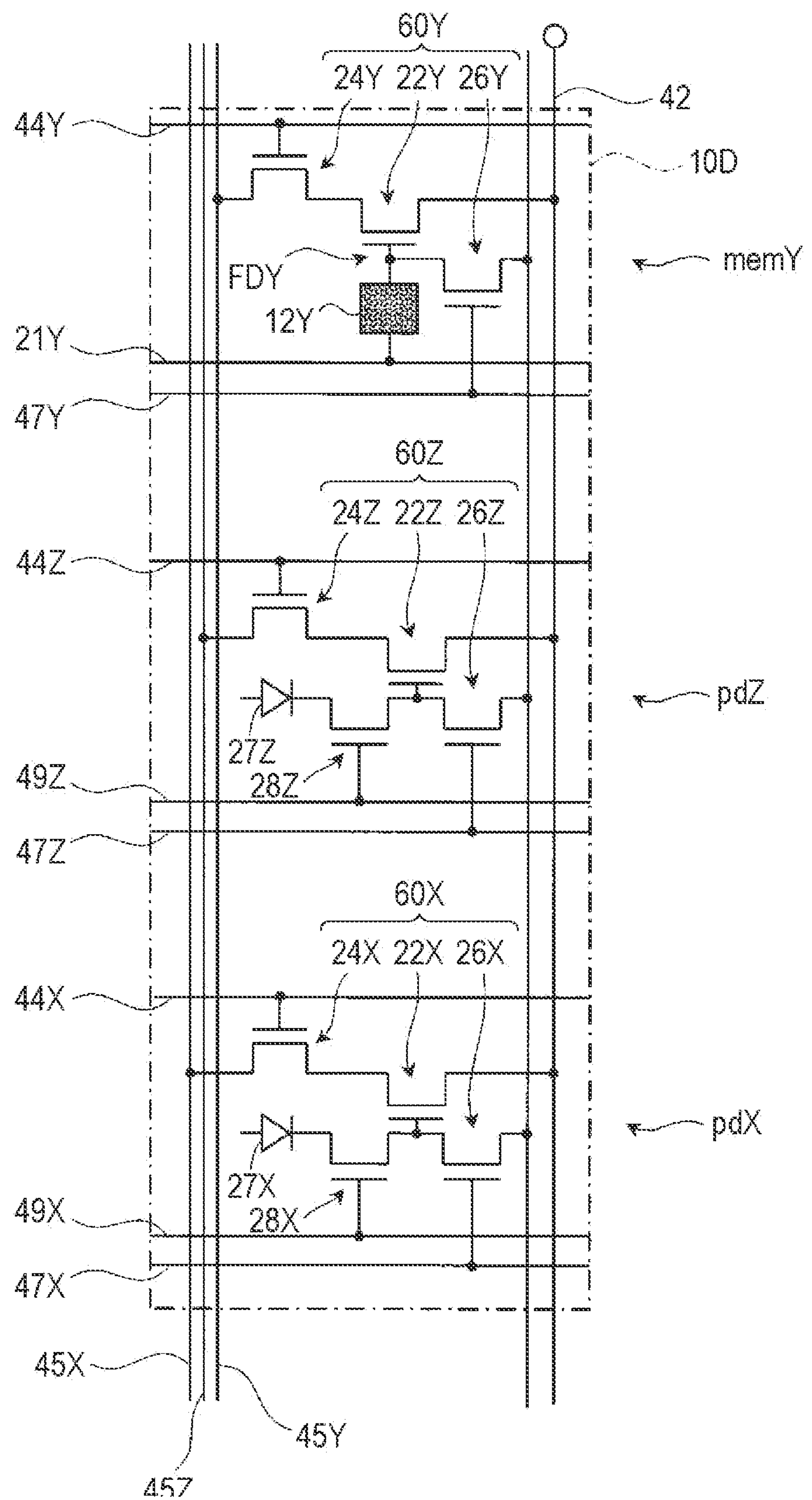
FIG. 16 is a schematic diagram of an example of an imaging apparatus according to a fourth embodiment of the disclosure.
Figure 17:
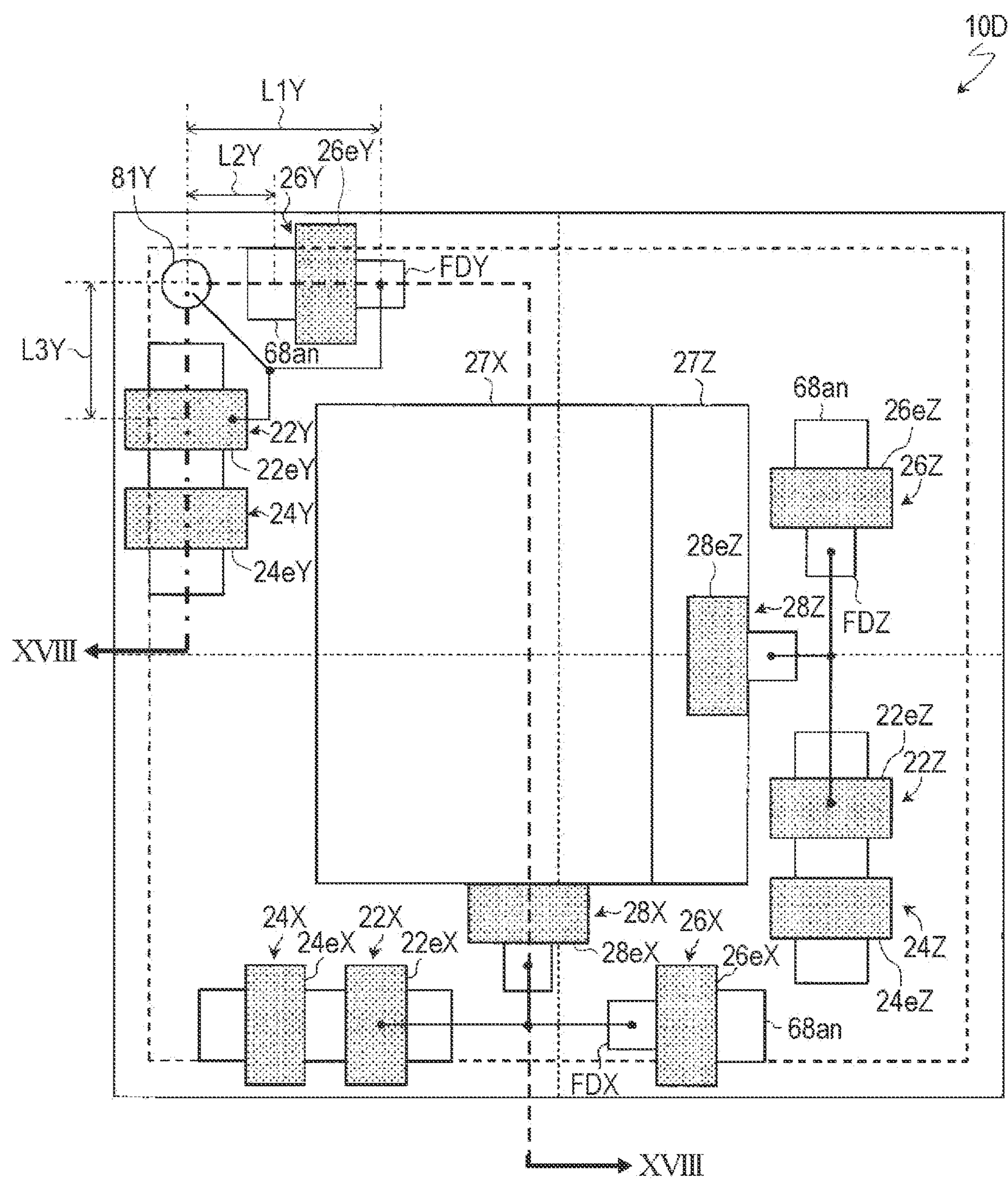
FIG. 17 is a plan view illustrating an example of a pixel according to the fourth embodiment of the disclosure.
Figure 18:
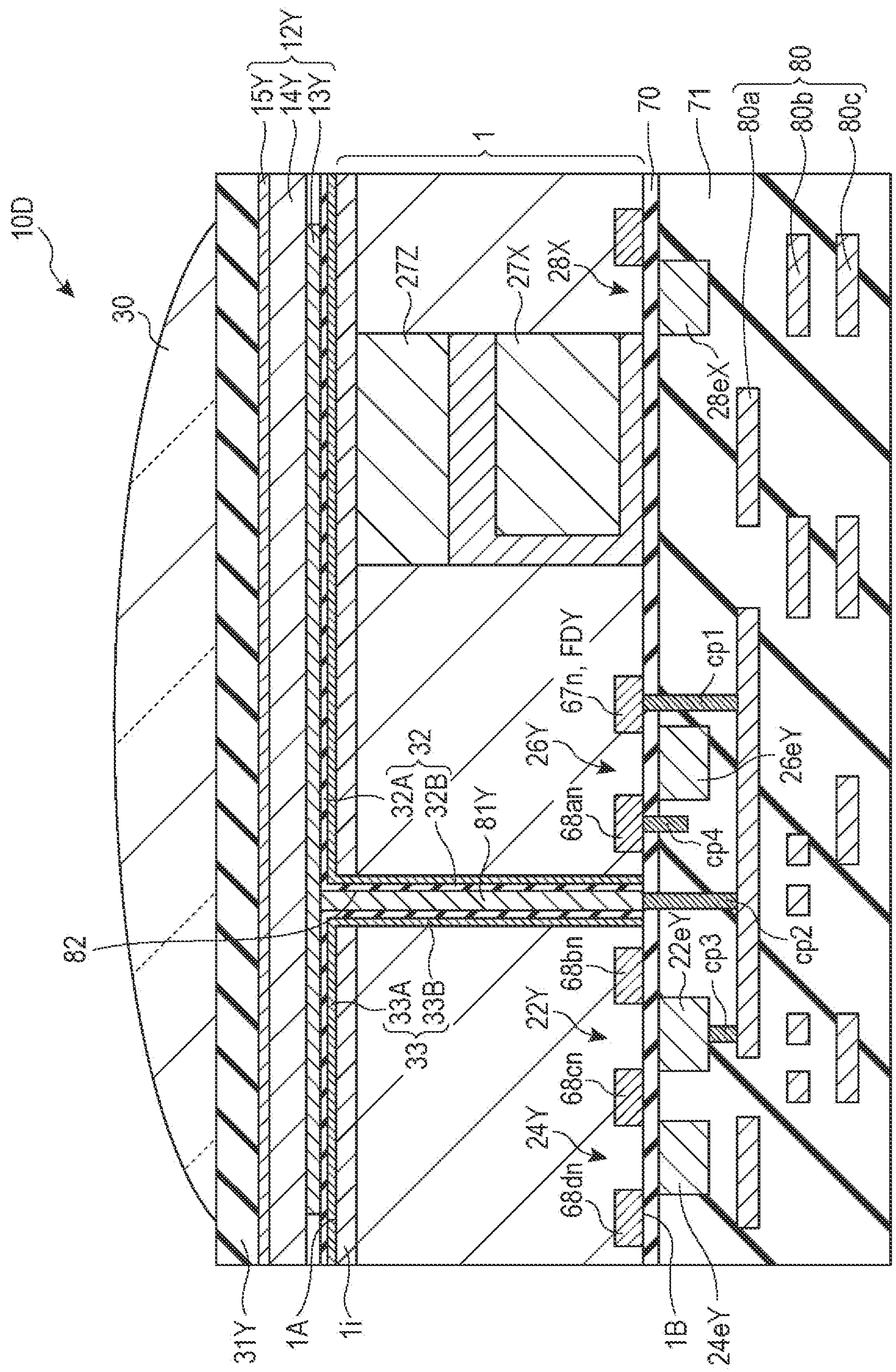
FIG. 18 is a cross-sectional view illustrating the pixel according to the fourth embodiment of the disclosure.

FIG. 16 illustrates an exemplary circuit configuration of a pixel 10D. FIG. 18 illustrates an example of a device structure of the pixel 10D. FIG. 17 schematically illustrates the layout of elements formed on or in the semiconductor substrate 1 when the pixel 10D in FIG. 18 is viewed along a line normal to the semiconductor substrate 1. If the pixel 10D is cut and displayed along a broken line XVIII-XVIII in FIG. 17, the cross-sectional view in FIG. 18 results.

Unlike the second and third embodiments, a fourth embodiment includes a single photoelectric conversion layer. The photoelectric conversion layer has a sensitivity to light rays. Specifically, the photoelectric conversion layer has a sensitivity to light rays in the wavelength range of green (G).

Unlike in the second and third embodiments, two photodiodes are laminated within semiconductor substrate 1 in the fourth embodiment. Typically, the two photodiodes photoelectrically converts light rays in the wavelength range that is not absorbed by the photoelectric conversion layer. Also, typically, the two photodiodes photoelectrically converts light rays in the wavelength ranges of different colors. Specifically, a photodiode 27X photoelectrically converts light rays in the wavelength range of red (R) and a photodiode 27Z photoelectrically converts light rays in the wavelength range of blue (B).

In the fourth embodiment, the photoelectric conversion layer and the two photodiodes have sensitivities to light rays in the wavelength ranges of three different colors. This configuration may be implemented without using any color filter.

The fourth embodiment is described in detail below.

Like the second embodiment, the fourth embodiment includes the pixel 10D having the second combination memY as illustrated in FIG. 16. Unlike the second and third embodiments, the fourth embodiment includes the pixel 10D having a first combination pdX and third combination pdZ.

Like the first combination memX, the first combination pdX includes the signal detecting circuit 60X. On other hand, unlike the first combination memX, the first combination pdX includes the photodiode 27X and transfer transistor 28X.

Like the third combination memZ, the third combination pdZ includes a signal detecting circuit 60Z. On the other hand, unlike the third combination memZ, the third combination pdZ includes the photodiode 27Z and transfer transistor 28Z.

In the fourth embodiment, the insulation layer 71, insulation layer 70, semiconductor substrate 1, photoelectric converter 12Y, insulation layer 31Y, and microlens 30 are laminated in this order. Specifically, these elements are laminated in the direction of the thickness of the semiconductor substrate 1.

The photodiodes 27X and 27Z are arranged in the semiconductor substrate 1. Specifically, the photodiodes 27X and 27Z are laminated within the semiconductor substrate 1. The photodiodes 27X and 27Z are laminated in the direction of the thickness of the semiconductor substrate 1. More specifically, the photodiode 27X is arranged in the semiconductor substrate 1 at a depth that allows light rays in the wavelength range of red (R) to be converted. The photodiode 27Z is arranged in the semiconductor substrate 1 at a depth that allows light rays in the wavelength range of blue (B) to be converted.

The photodiodes 27X and 27Z have sensitivities to light rays. Specifically, the photodiodes 27X and 27Z photoelectrically convert light rays in the wavelength ranges that are not absorbed by the photoelectric converter 12Y. More specifically, the photodiode 27X photoelectrically converts light rays in in the wavelength range of red (R). The photodiode 27Z photoelectrically converts light rays in the wavelength range of blue (B).

The photodiode 27X, when irradiated with light, creates charges. The created charges are accumulated as signal charges in the photodiode 27X. According to the fourth embodiment, the signal charges are negative. Specifically, the signal charges are electrons. The photodiode 27X is an n-type impurity layer.

The transfer transistor 28X is arranged on or in the semiconductor substrate 1. Specifically, the transfer transistor 28X is arranged on the second principal surface 1B.

The photodiode 27Z, when irradiated with light, creates charges. The created charges are accumulated as signal charges in the photodiode 27Z.

The transfer transistor 28Z is arranged on or in the semiconductor substrate 1. Specifically, the transfer transistor 28Z is arranged on the second principal surface 1B.

The transfer transistor 28X and transfer transistor 28Z are MOSFETs. Specifically, the transfer transistor 28X and transfer transistor 28Z are n-channel MOSFETs.

The transfer transistor 28X transfers the signal charges from the photodiode 27X to the charge accumulation region FDX. In the fourth embodiment as well as in the second and third embodiments, the charge accumulation region FDX is the first diffusion region 67*n* as one of the source and the drain of the reset transistor 26X serving as the first transistor.

The transfer transistor 28Z transfers the signal charges from the photodiode 27Z to the charge accumulation region FDZ. In the fourth embodiment as well as in the second and third embodiments, the charge accumulation region FDZ is the first diffusion region 67*n* as one of the source and the drain of the reset transistor 26Z serving as the first transistor.

A transfer signal line 49X connected to the vertical scanning circuit 52 is connected to a gate electrode 28*e*X of the transfer transistor 28X. Like the address signal line 44X, the transfer signal line 49X is arranged on each row of multiple pixels 10D. The vertical scanning circuit 52 may turn the transfer transistor 28X by applying to the gate electrode 28*e*X of the transfer transistor 28X via the transfer signal line 49X a transfer signal that controls the on-off operation of the transfer transistor 28X. With the transfer transistor 28X turned on, the signal charges accumulated in the photodiode 27X are transferred to the charge accumulation region FDX.

The transfer signal line 49Z connected to the vertical scanning circuit 52 is connected to a gate electrode 28*e*Z of the transfer transistor 28Z. Like the address signal line 44Z, the transfer signal line 49Z is arranged on each row of multiple pixels 10D. The vertical scanning circuit 52 may turn the transfer transistor 28Z on by applying to the gate electrode 28*e*Z of the transfer transistor 28Z via the transfer signal line 49Z a transfer signal that controls the on-off operation of the transfer transistor 28Z. With the transfer transistor 28Z turned on, the signal charges accumulated in the photodiode 27Z are transferred to the charge accumulation region FDZ.

Fifth Embodiment

Figure 19:
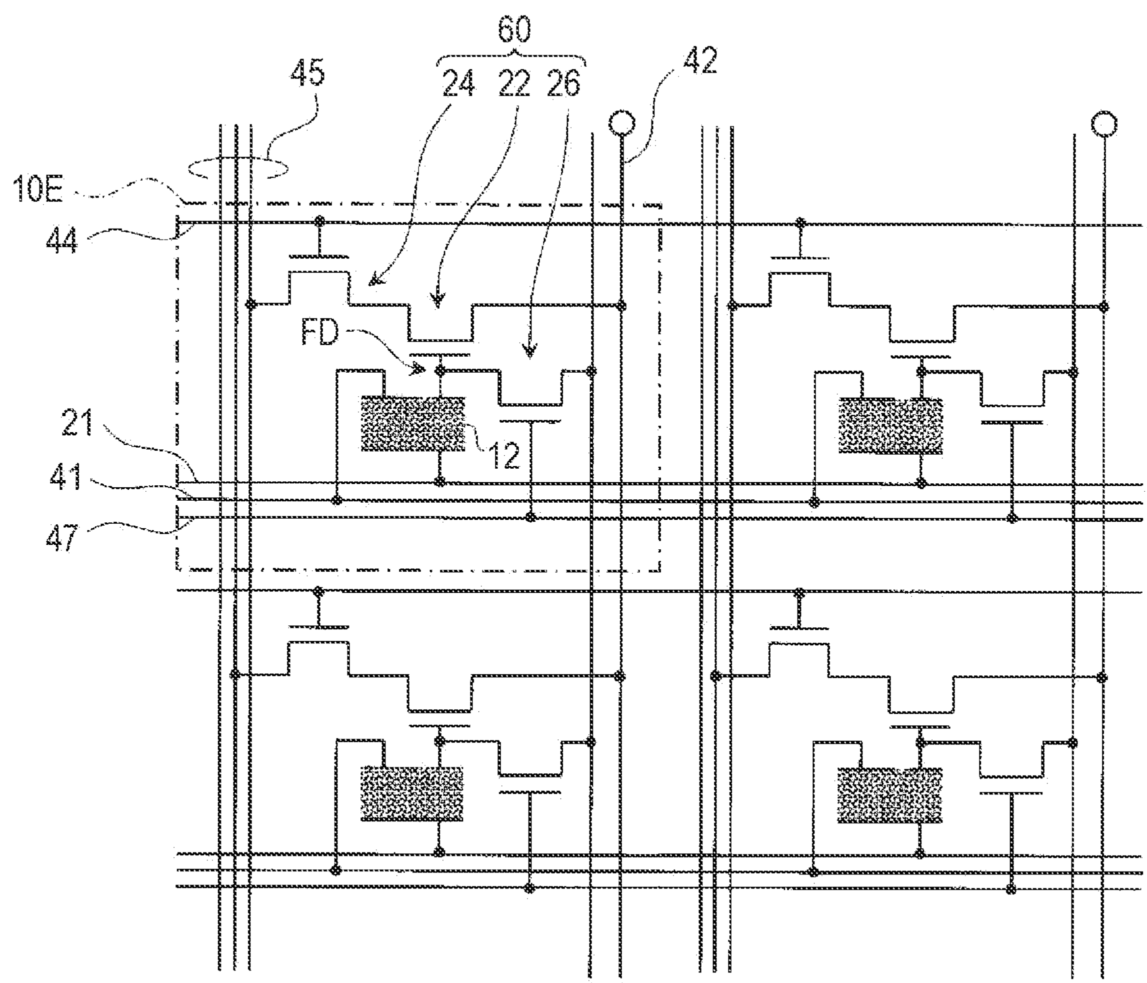
FIG. 19 is a schematic diagram illustrating an example of an imaging apparatus according to a fifth embodiment of the disclosure.
Figure 20:
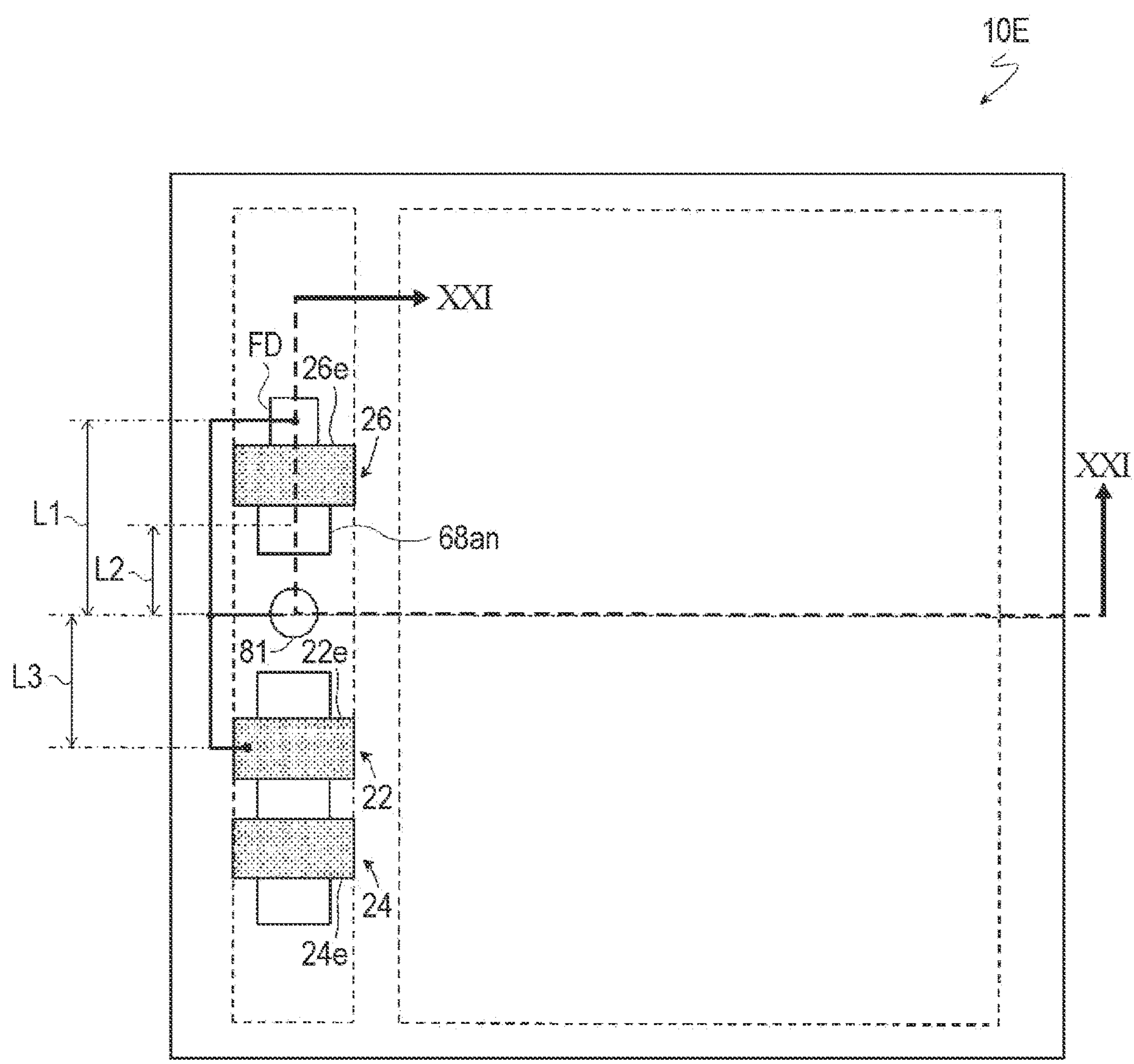
FIG. 20 is a plan view illustrating an example of a pixel according to the fifth embodiment of the disclosure.
Figure 21:
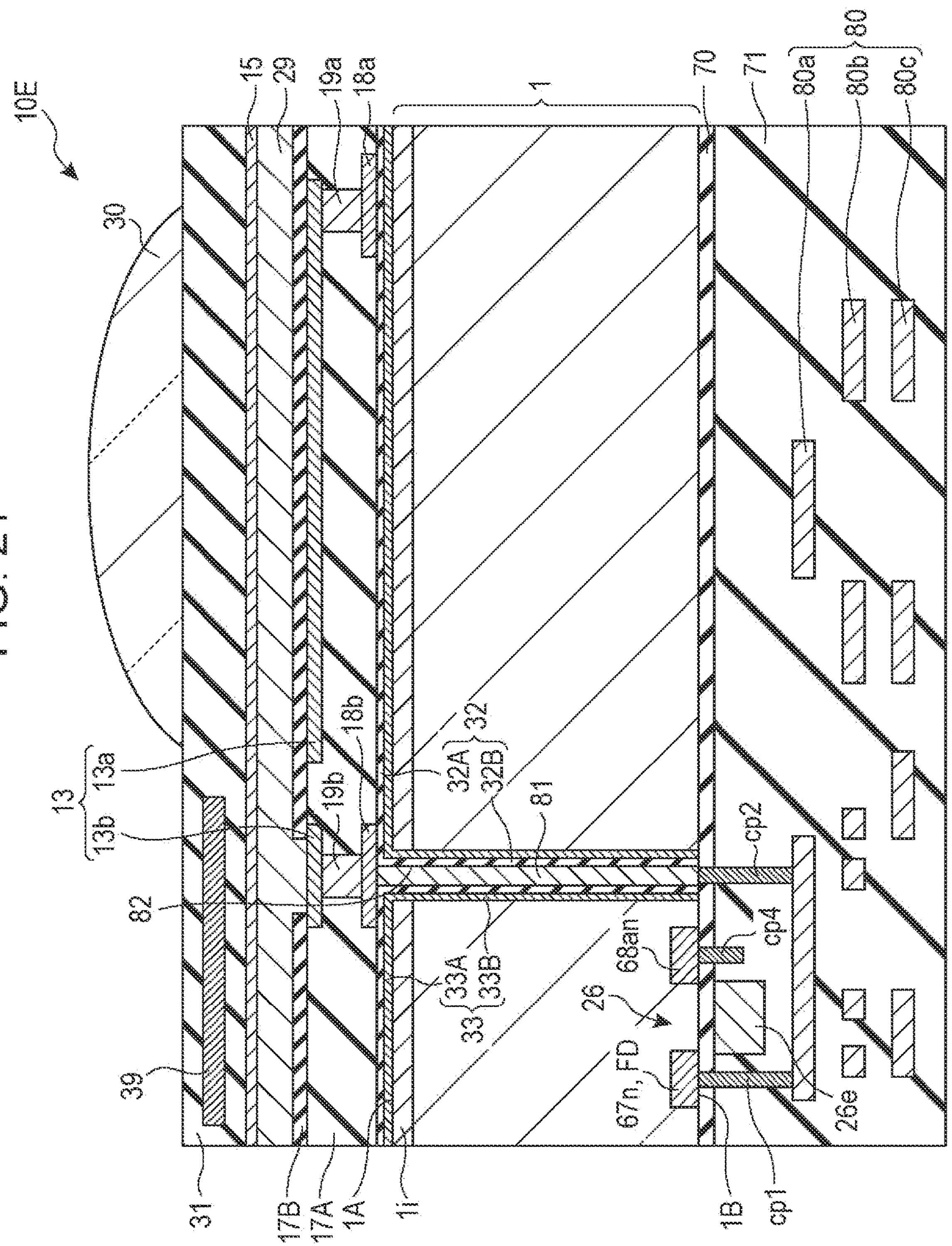
FIG. 21 is a cross-sectional view illustrating an example of the pixel according to the fifth embodiment of the disclosure.

FIG. 19 illustrates an exemplary circuit configuration of a pixel 10E. FIG. 21 illustrates an example of a device structure of the pixel 10E. FIG. 20 schematically illustrates the layout of elements formed on or in the semiconductor substrate 1 when the pixel 10E in FIG. 21 is viewed along a line normal to the semiconductor substrate 1. If the pixel 10E is cut and displayed along a broken line XXI-XXI in FIG. 20, the cross-sectional view in FIG. 21 results.

In a fifth embodiment, the photoelectric converter 12 includes the pixel electrode 13, photoelectric conversion laminate 29, and counter electrode 15.

The first flat membrane region 32A of the dielectric layer 32, the pixel electrode 13 and insulation layer 17A, the photoelectric conversion laminate 29 and insulation layer 17B, and the counter electrode 15 are laminated in this order. Specifically, these elements are laminated in the direction of the thickness of the semiconductor substrate 1.

Figure 22:
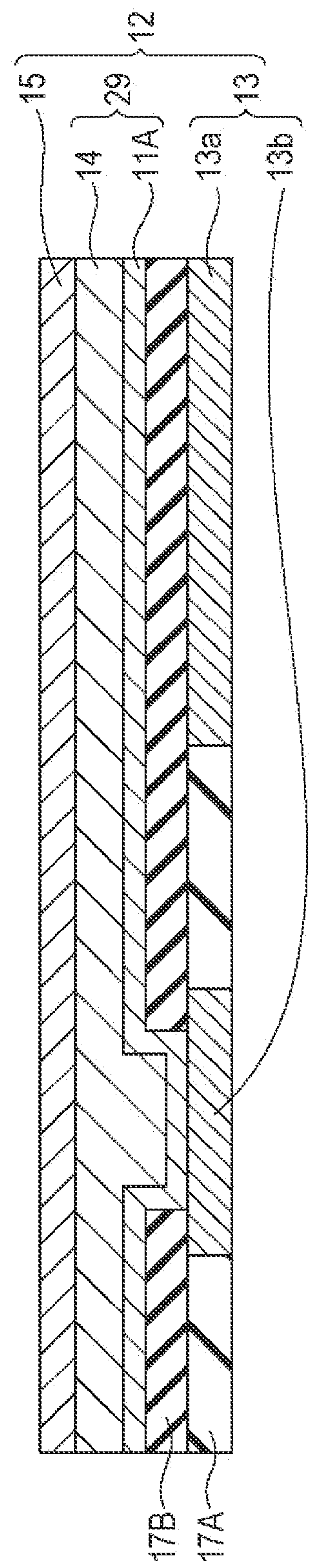
FIG. 22 illustrates an example of a photoelectric conversion layer.

FIG. 22 illustrates the structure of the photoelectric conversion laminate 29. Referring to FIG. 22, the photoelectric conversion laminate 29 includes the oxide semiconductor layer 11A and photoelectric conversion layer 14. Specifically, the photoelectric conversion laminate 29 includes the oxide semiconductor layer 11A and photoelectric conversion layer 14 in this order in a direction from the pixel electrode 13 to the counter electrode 15. The oxide semiconductor layer 11A is in contact with the photoelectric conversion layer 14.

The oxide semiconductor layer 11A contains at least one composition selected from the group consisting of indium oxide, gallium oxide, zinc oxide, and tin oxide.

The pixel electrode 13 includes the accumulation electrode 13*a* and reading electrode 13*b* separated from each other. Specifically, the accumulation electrode 13*a* is separated from the reading electrode 13*b* by the insulation layer 17A.

Not only the accumulation electrode 13*a* and reading electrode 13*b* but also junctions 19*a* and 19*b*, and pads 18*a* and 18*b* are arranged within the insulation layer 17A.

The insulation layer 17B is arranged on the insulation layer 17A. Through holes are arranged in insulation layer 17B.

Part of the oxide semiconductor layer 11A extends in the through hole of the insulation layer 17B and is contact with the reading electrode 13*b*. Another part of the oxide semiconductor layer 11A is in contact with the insulation layer 17B in an area that does not overlap the accumulation electrode 13*a* in a plan view. Yet another part of the oxide semiconductor layer 11A is in contact with the insulation layer 17B in an area that overlaps the accumulation electrode 13*a* in a plan view.

The accumulation electrode 13*a* is electrically connected to the pad 18*a* via the junction 19*a*. The reading electrode 13*b* is electrically connected to the penetrating electrode 81 via a laminate of the junction 19*b* and pad 18*b* in this order.

In the fourth embodiment, the vertical scanning circuit 52 is connected to the pixel electrode power source line 41. A voltage may be applied from the vertical scanning circuit 52 to the accumulation electrode 13*a* via the pixel electrode power source line 41. Also, a voltage may be applied from the vertical scanning circuit 52 to the counter electrode 15 via the counter electrode power source line 21.

An accumulation period and transfer period are implemented by adjusting the voltage of the counter electrode 15 and the voltage of the accumulation electrode 13*a*. During the accumulation period, charges created by the photoelectric conversion layer 14 are attracted to the accumulation electrode 13*a* and held within the oxide semiconductor layer 11A or the like. During the accumulation time, the charges are accumulated in the oxide semiconductor layer 11A or the like. During the transfer period, the charges in the oxide semiconductor layer 11A or the like are transferred to the charge accumulation region FD via the reading electrode 13*b* and penetrating electrode 81.

In a specific operation example, the voltage of the charge accumulation region FD is reset in reset control subsequent to the accumulation period but prior to the transfer period.

A transfer control electrode may be arranged between the accumulation electrode 13*a* and reading electrode 13*b* in a plan view in a manner such that the transfer control electrode is separated from each of the accumulation electrode 13*a* and reading electrode 13*b*. If the voltage of the counter electrode 15, the voltage of the accumulation electrode 13*a*, and the voltage of the transfer control electrode are adjusted, the movement of the charges created by the photoelectric conversion layer 14 during the accumulation period toward the reading electrode 13*b* may be more easily restricted.

A light-shielding film 39 is arranged within the insulation layer 31. The light-shielding film 39 is arranged to overlap the reading electrode 13*b* in a plan view. The light-shielding film 39 may control photoelectric conversion in an area where the photoelectric conversion layer 14 overlaps the reading electrode 13*b* in a plan view. With this arrangement, all the pixels may be more easily reset and a global shutter function may be more easily implemented.

Figure 23:
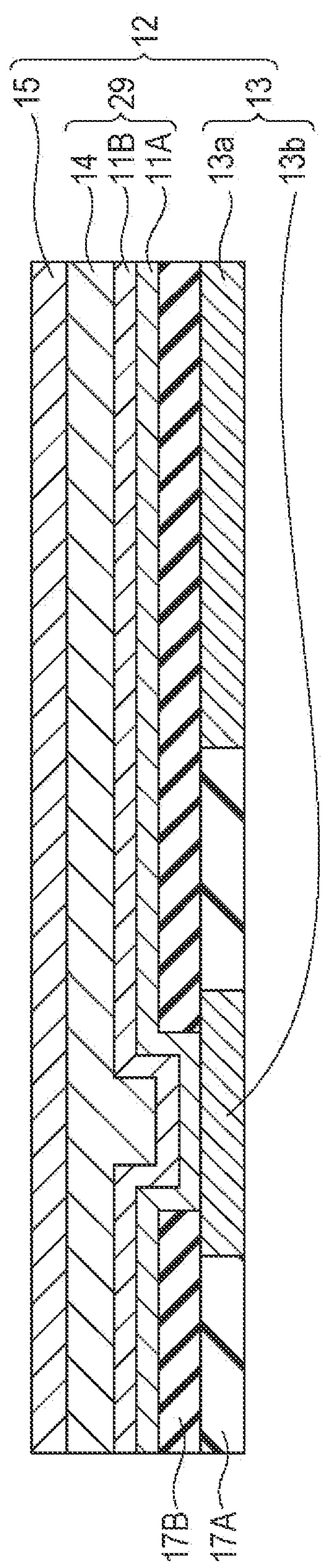
FIG. 23 illustrates an example of the photoelectric conversion layer.

Referring to FIG. 23, the photoelectric conversion laminate 29 may include an oxide film 11B in addition to the oxide semiconductor layer 11A and photoelectric conversion layer 14. Specifically, as illustrated in FIG. 23, the oxide semiconductor layer 11A, oxide film 11B, and photoelectric conversion layer 14 are laminated in the photoelectric conversion laminate 29 from the pixel electrode 13 to the counter electrode 15. The oxide semiconductor layer 11A is in contact with the oxide film 11B. The oxide film 11B is in contact with the photoelectric conversion layer 14. The oxide film 11B stabilizes the oxide semiconductor layer 11A. In this example, the oxide film 11B is sufficiently thin. For this reason, charges may be transferred through the oxide film 11B via the tunnelling effect.

The oxide film 11B contains at least one of a tunnel oxide film or metal oxide. The tunnel oxide film contains at least one composition selected from the group consisting of $SiO_X$, SiON, SiOC, and $ALO_Y$. The metal oxide contains at least one composition selected from the group consisting of tantalum oxide, titanium oxide, vanadium oxide, niobium oxide, tungsten oxide, zirconium oxide, hafnium oxide, scandium oxide, yttrium oxide, lanthanum oxide, gallium oxide, and magnesium oxide.

Techniques disclosed in the fourth embodiment may be applicable to all the preceding embodiments.

According to the embodiments described above, the effect of the leakage current may be controlled and an imaging apparatus enabled to performing higher imaging quality may be provided.

In the discussion of the embodiments, a back-illuminated imaging apparatus has been described. The disclosure may be applicable to a front-illuminated imaging apparatus.

According to the embodiments of the disclosure, an imaging apparatus that performs higher quality imaging by restricting the effect of the leakage current may be provided. The imaging apparatuses of the embodiments of the disclosure may be applicable to an image sensor, a digital camera, and the like. The imaging apparatuses of the embodiments of the disclosure may be applicable to a medical camera, a camera for use in a robot, a security camera, a camera for use in a vehicle, and the like.

What is claimed is:

1. An imaging apparatus comprising:

a substrate;

a first electrode;

a second electrode;

a photoelectric conversion layer that is located between the first electrode and the second electrode and that converts light into charges, a first transistor that includes a first impurity region serving as one of a source and a drain, a second impurity region serving as the other of the source and the drain, and a first gate electrode; and a penetrating electrode that penetrates the substrate and that electrically connects the first electrode to the first impurity region, wherein the charges are accumulated in the first impurity region, and a distance between the first impurity region and the penetrating electrode is longer in a plan view than a distance between the second impurity region and the penetrating electrode.

2. The imaging apparatus according to claim 1, wherein the first gate electrode is located in the plan view between the penetrating electrode and the first impurity region.

3. The imaging apparatus according to claim 1, further comprising a second transistor including a second gate electrode electrically connected to the first impurity region, wherein the distance between the first impurity region and the penetrating electrode is longer in the plan view than a distance between the second gate electrode and the penetrating electrode.

4. The imaging apparatus according to claim 1, wherein an area of the first impurity region is smaller in the plan view than an area of the second impurity region.

5. The imaging apparatus according to claim 1, further comprising a first electrical passage that electrically connects the penetrating electrode to the first impurity region, wherein at least part of the first electrical passage is bent in the plan view.

6. The imaging apparatus according to claim 1, further comprising:

a first electrical passage that electrically connects the penetrating electrode to the first impurity region; and a gate wiring that is electrically connected to the first gate electrode, wherein if a combination of the first gate electrode and the gate wiring is defined as a second electrical passage, the first electrical passage circumvents the second electrical passage in the plan view.

7. The imaging apparatus according to claim 1, further comprising:

a first electrical passage that electrically connects the penetrating electrode to the first impurity region; and a gate wiring that is electrically connected to the first gate electrode, wherein if a combination of the first gate electrode and the gate wiring is defined as a second electrical passage, at least part of the first electrical passage overlaps at least part of the second electrical passage in the plan view.

8. The imaging apparatus according to claim 1, wherein at least part of the first electrode overlaps at least part of the first impurity region in the plan view.

9. The imaging apparatus according to claim 1, wherein the first transistor is a reset transistor that resets a potential of the first impurity region.

* * * * *